(12) United States Patent
Van Der Toorn et al.

(10) Patent No.: US 11,996,263 B2
(45) Date of Patent: May 28, 2024

(54) STAGE APPARATUS

(71) Applicant: ASML Netherlands B.V., Veldhoven (NL)

(72) Inventors: Jan-Gerard Cornelis Van Der Toorn, Eindhoven (NL); Paulus Martinus Hubertus Vissers, Nederweert (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 18/196,296

(22) Filed: May 11, 2023

(65) Prior Publication Data

US 2023/0360879 A1    Nov. 9, 2023

Related U.S. Application Data

(60) Division of application No. 17/351,043, filed on Jun. 17, 2021, now Pat. No. 11,694,870, which is a continuation of application No. PCT/EP2019/084733, filed on Dec. 11, 2019.

(30) Foreign Application Priority Data

Dec. 20, 2018    (EP) .................................... 18214915

(51) Int. Cl.
*H01J 37/20* (2006.01)
*H02G 11/00* (2006.01)

(52) U.S. Cl.
CPC .............. *H01J 37/20* (2013.01); *H02G 11/00* (2013.01); *H01J 2237/0262* (2013.01); *H01J 2237/2007* (2013.01)

(58) Field of Classification Search
CPC ............... H01J 37/20; H01J 2237/0262; H01J 2237/2007; H01J 2237/026; H01J 2237/20; H02G 11/00

See application file for complete search history.

(56) References Cited

U.S. PATENT DOCUMENTS 9,134,261 B2 *  9/2015  Yoshikawa  .............  H01J 37/09
9,726,985 B2    8/2017  Van De Ven et al.
(Continued)

FOREIGN PATENT DOCUMENTS

EP    1347337 A2    9/2003
EP    1347337 A3    8/2005
(Continued)

OTHER PUBLICATIONS

International Search Report and Written Opinion issued in related PCT Application No. PCT/EP2019/084733, dated Jul. 7, 2020, 19 pages.

(Continued)

*Primary Examiner* — David A Vanore
(74) *Attorney, Agent, or Firm* — Finnegan, Henderson, Farabow, Garrett & Dunner, LLP

(57) ABSTRACT

The present disclosure relates to a stage apparatus comprising: an object table configured to hold a substrate, the object table comprising an electrode configured to be charged by a power source and an electrical connection configured to electrically connect the electrode to the power source, and an electric field shield configured to shield at least a part of the electrical connection.

20 Claims, 15 Drawing Sheets

(56) References Cited

U.S. PATENT DOCUMENTS

| | | | |
|---|---|---|---|
| 11,694,870 B2* | 7/2023 | Van Der Toorn | H02G 11/00 250/491.1 |
| 2003/0136923 A1 | 7/2003 | Watson | |
| 2004/0027781 A1* | 2/2004 | Hanawa | H01J 37/32724 361/234 |
| 2007/0146656 A1* | 6/2007 | Van Empel | G03F 7/70058 355/53 |
| 2008/0158539 A1* | 7/2008 | Shibata | G03F 7/70758 355/72 |
| 2009/0317964 A1* | 12/2009 | Suuronen | H01L 21/6875 165/104.19 |
| 2011/0051306 A1* | 3/2011 | Wang | H01J 37/28 361/212 |
| 2012/0057140 A1* | 3/2012 | Aoki | H02K 41/031 430/320 |
| 2012/0235036 A1* | 9/2012 | Hatakeyama | H01J 37/20 250/310 |
| 2012/0267050 A1* | 10/2012 | Sakka | H01J 37/32119 156/345.39 |
| 2013/0026385 A1* | 1/2013 | Winkler | H01J 37/09 29/592.1 |
| 2013/0043413 A1* | 2/2013 | De Boer | H01J 37/3177 156/196 |
| 2013/0293865 A1* | 11/2013 | Ummethala | G03F 7/70716 355/75 |
| 2014/0253900 A1* | 9/2014 | Cornelissen | G03F 7/70875 355/72 |
| 2014/0375975 A1* | 12/2014 | Van De Ven | G03F 7/709 355/72 |
| 2015/0029484 A1* | 1/2015 | Kii | G03F 7/70 355/72 |
| 2017/0069458 A1* | 3/2017 | Shouji | H01J 37/26 |
| 2019/0324375 A1* | 10/2019 | Peijster | G03F 7/70833 |
| 2021/0375580 A1* | 12/2021 | Van Der Toorn | H01J 37/20 |
| 2022/0392734 A1* | 12/2022 | Sarov | H01J 37/09 |

FOREIGN PATENT DOCUMENTS

| | | |
|---|---|---|
| EP | 3285281 A1 | 2/2018 |
| TW | 200408000 A | 5/2004 |
| TW | 201805990 A | 2/2018 |
| WO | WO 2006/023700 A2 | 3/2006 |

OTHER PUBLICATIONS

Office Action issued by the Intellectual Property Office (IPO) in related ROC (Taiwan) Patent Application No. 108146589, dated Sep. 18, 2020, 15 pages.

* cited by examiner

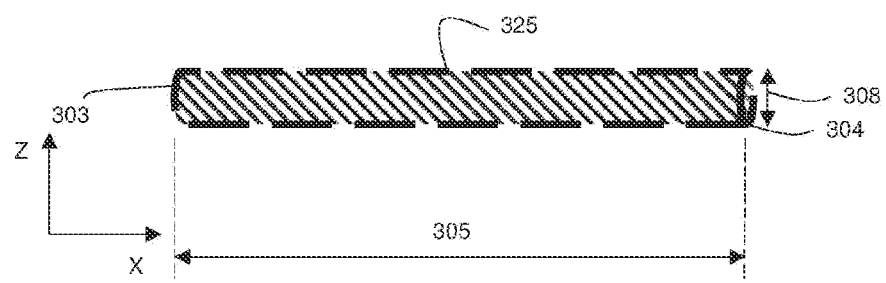
FIG. 6c
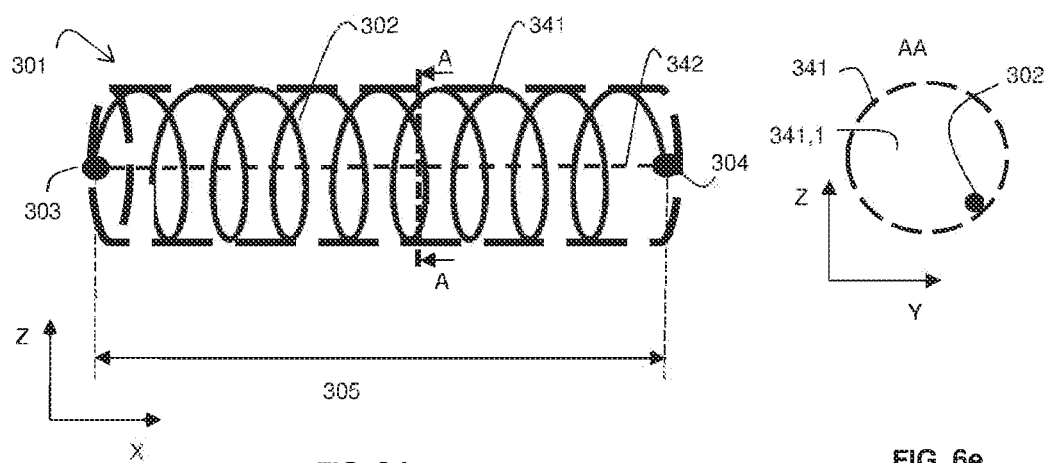
FIG. 6d
FIG. 6e

STAGE APPARATUS

CROSS-REFERENCE TO RELATED APPLICATIONS

This application is a divisional of U.S. patent application Ser. No. 17/351,043 filed on Jun. 17, 2021, which claims priority of International Application No. PCT/EP2019/084733 filed on Dec. 11, 2019, which claims priority to EP application 18214915.3 which was filed on Dec. 20, 2018. Each of these aforementioned applications are incorporated herein by reference in their entireties.

FIELD

The embodiments of the present disclosure relate to a stage apparatus, in particular a stage apparatus comprising an electrical connection configured to electrically connect an electrode to a voltage source.

BACKGROUND ART

The embodiments of the present disclosure relate to a stage apparatus that can for example be part of a lithographic apparatus, a metrology apparatus, a particle beam apparatus, an electron beam apparatus, an electron beam inspection apparatus, or an inspection apparatus.

In the semiconductor processes, defects are inevitably generated. Such defects may impact device performance even up to failure. Device yield may thus be impacted, resulting in increased costs. In order to control semiconductor process yield, defect monitoring is important. One tool useful in defect monitoring is an SEM (Scanning Electron Microscope) which scans a target portion of a specimen using one or more beams of electrons.

To avoid or at least to reduce the damages on the specimen by the electron beam(s) irradiated onto the specimen, a high negative voltage may be applied in a path of the electron beam(s) to decelerate the electron beam(s) before the electron beam(s) landing on the specimen.

The high voltage may be applied, for example, to an object table to support and hold the specimen during the monitoring. Such high voltage is preferably provided through a thick wire which may disturb accurate positioning of the object table.

SUMMARY

One of the objects of the present disclosure is to provide an electrical connection with limited maximal electric field intensity while at the same time having a limited mechanical stiffness, or at least to provide an alternative stage apparatus with an electrical connection configured to connect an electrode to a terminal.

The embodiments of the present disclosure relate to a stage apparatus comprising an innovative electrical connection, which may be described or defined in several ways.

In some embodiments, a stage apparatus comprises: an object table configured to hold a substrate, the object table comprising an electrode configured to be charged by a power source and an electrical connection configured to electrically connect the electrode to the power source, and an electric field shield configured to shield at least a part of the electrical connection.

In some embodiments, a stage apparatus comprises: an object table configured to hold a substrate, the object table comprising an electrode configured to be charged by a power source and an electrical connection configured to electrically connect the electrode to the power source, wherein the electrical connection comprises one or more coils, or one or more wires arranged on a circular circumference.

In some embodiments, a stage apparatus comprises an object table configured to hold a substrate, the object table comprising an electrode configured to be charged by a power source and an electrical connection configured to connect a first terminal electrically connected to the electrode to a second terminal electrically connected to the power source. The electrical connection comprises a spatial arrangement of one or more wires having a diameter, and spanning a distance in a first direction between a first end and a second end of the electrical connection. The electrical connection is configured to produce, in use, an electric field, which is partly determined by an equivalent electrical diameter which is defined by the spatial arrangement of the one or more wires, and equals a diameter of an electrically equivalent wire when arranged substantially straight and for spanning the distance in the first direction, wherein the electrically equivalent wire would produce an electric field having the substantially same maximal intensity, The equivalent electrical diameter is larger than any diameter of the one or more wires.

In some embodiments, the electrical connection further comprises a mechanical stiffness, which represents a force required to compress or stretch the electrical connection for a unit length in the first direction, for which an equivalent mechanical diameter is determined. The equivalent mechanical diameter equals a diameter of a mechanically equivalent wire when arranged substantially straight and for spanning the distance in the first direction and wherein the mechanically equivalent wire would comprise the same mechanical stiffness as the electrical connection. The equivalent electrical diameter is larger than the equivalent mechanical diameter.

In some embodiments, a stage apparatus comprises an object table configured to hold a substrate, the object table comprising an electrode configured to be charged by a power source and an electrical connection configured to connect a first terminal electrically connected to the electrode to a second terminal electrically connected to the power source. In these embodiments, the electrical connection comprises one or more wires each having a length and a diameter, arranged such that, in use, for at least, for example, 75%, 80%, 85%, 90%, 95%, or 99% of locations along the length of each wire at least one wire segment of one of the wires is arranged in the vicinity of said location of the wire. Being arranged in the vicinity is for example defined as being arranged in a direction perpendicular to the wire at said location at a distance smaller than or equal to, for example, 4 times, 5 times, or 6 times the diameter of the wire.

In some embodiments, a stage apparatus comprises an object table configured to hold a substrate, the object table comprising an electrode configured to be charged by a power source and an electrical connection configured to connect a first terminal electrically connected to the electrode to a second terminal electrically connected to the power source. The electrical connection comprises an electrical conductive substance, and spans a distance in a first direction between a first end and a second end of the electrical connection. In these embodiments, the electrical connection further comprises a virtual enveloping volume being defined to comprise substantially all the electrical conductive substance, wherein outer parts of the electrical connection define outer borders the virtual enveloping volume in, and the virtual enveloping volume comprises a void having a volume of at least, for example, 1%, 5% or 10% of a volume of the virtual enveloping volume wherein. For each cross-section of the virtual enveloping volume, a total area of the electrical conductive substance within the cross-section is smaller than an area of said cross-section.

In some embodiments, a stage apparatus comprises an object table configured to hold a substrate, the object table comprising an electrode configured to be charged by a power source and an electrical connection configured to connect a first terminal electrically connected to the electrode to a second terminal electrically connected to the power source. The electrical connection comprises one or more wires having a diameter and spanning a distance between a first end and a second end of the electrical connection, and the electrical connection is arranged such that the maximal electric field intensity generated by the electrical connection is smaller than the maximal electric field intensity generated by a straight wire of the same diameter and spanning the same distance.

In some embodiments, a stage apparatus comprises an object table configured to hold a substrate, the object table comprising an electrode configured to be charged by a power source and an electrical connection configured to connect a first terminal electrically connected to the electrode to a second terminal electrically connected to the power source. In these embodiments, the electrical connection comprises at least one wire comprising a plurality of loops between a first end and a second end of the electrical connection, the plurality of loops being arranged substantially parallel to each other, such that, during use, corresponding portions of adjacent loops are spaced apart over a distance smaller than or equal to, for example, 4 times, 5 times, or 6 times a diameter of the wire.

In some embodiments, a stage apparatus comprises an object table configured to hold a substrate, the object table comprising an electrode configured to be charged by a power source and an electrical connection configured to connect a first terminal electrically connected to the electrode to a second terminal electrically connected to the power source. In these embodiments, the electrical connection comprises a plurality of wires arranged as a bundle connector and not arranged in a single plane, a nominal distance between adjacent wires of the bundle connector being smaller or equal to, for example, 4 times, 5 times, or 6 times the diameter of the wires.

In some embodiments, a stage apparatus comprises an object table configured to hold a substrate, the object table comprising an electrode configured to be charged by a power source and an electrical connection configured to connect a first terminal electrically connected to the electrode to a second terminal electrically connected to the power source. The electrical connection comprises a cylinder made of electrical conductive substance, comprising a plurality of apertures.

The embodiments of the present disclosure relate to an apparatus comprising a stage apparatus, wherein the apparatus is a lithographic apparatus, a metrology apparatus, a particle beam apparatus, an electron beam apparatus, an electron beam inspection apparatus, or an inspection apparatus.

BRIEF DESCRIPTION OF THE DRAWINGS

The present disclosure will be readily understood by the following detailed description in conjunction with the accompanying drawings, wherein like reference numerals designate like structural elements, and in which:

FIG. 6a-6e illustrate an example embodiment of the electrical connection.

Figure 1A:
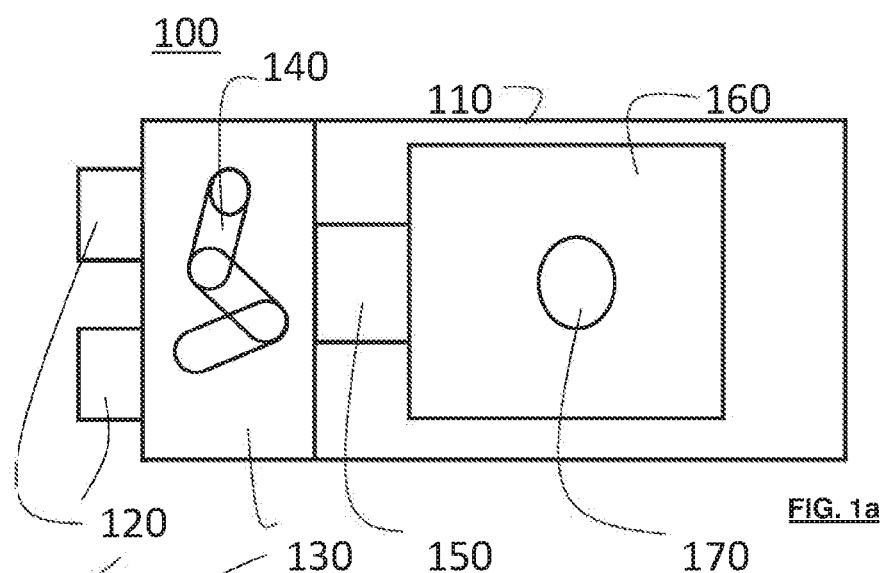
FIGS. 1a and 1b are schematic illustrations of an e-beam inspection tool according to some embodiments of the present disclosure.

While the disclosed embodiments are susceptible to various modifications and alternative forms, specific embodiments thereof are shown by way of example in the drawings and may herein be described in detail. The drawings may not be to scale. It should be understood, however, that the drawings and detailed description thereto are not intended to limit the disclosure to the particular form disclosed, but on the contrary, the intention is to cover all modifications, equivalents and alternatives falling within the spirit and scope of the embodiments of the present disclosure as defined by the appended claims.

DETAILED DESCRIPTION OF EXAMPLE EMBODIMENTS

Various example embodiments of the present disclosure will now be described more fully with reference to the accompanying drawings in which some example embodiments of the present disclosure are shown. In the drawings, the thicknesses of layers and regions may be exaggerated for clarity.

Detailed illustrative embodiments of the present disclosure are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the present disclosure are capable of various modifications and alternative forms, embodiments thereof are shown by way of example in the drawings and will herein be described in detail. It should be understood, however, that there is no intent to limit example embodiments of the present disclosure to the particular forms disclosed, but on the contrary, example embodiments of the present disclosure are to cover all modifications, equivalents, and alternatives falling within the scope of the present disclosure. Like numbers refer to like elements throughout the description of the figures.

As used herein, the term "specimen" generally refers to a wafer or any other specimen on which defects of interest (DOI) may be located. Although the terms "specimen" and "sample" are used interchangeably herein, it is to be understood that embodiments described herein with respect to a wafer may configured and/or used for any other specimen (e.g., a reticle, mask, or photomask).

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

The term, crossover, refers to a point where the electron beam is focused.

The term, virtual source, means the electron beam emitted from the cathode can be traced back to a "virtual" source.

The inspection tool according to the present invention may relate to a charged particle source, especially to an e-beam source which can be applied to a SEM, an e-beam inspection tool, or an EBDW. The e-beam source, in this art, may also be referred to as an e-gun (Electron Gun).

With respect to the drawings, it is noted that the figures are not drawn to scale. In particular, the scale of some of the elements of the figures may be greatly exaggerated to emphasize characteristics of the elements. It is also noted that the figures are not drawn to the same scale. Elements shown in more than one figure that may be similarly configured have been indicated using the same reference numerals.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the present disclosure are capable of various modifications and alternative forms, embodiments thereof are shown by way of example in the drawings and will herein be described in detail. It should be understood, however, that there is no intent to limit example embodiments of the present disclosure to the particular forms disclosed, but on the contrary, example embodiments of the present disclosure are to cover all modifications, equivalents, and alternatives falling within the scope of the present disclosure.

Figure 1B:
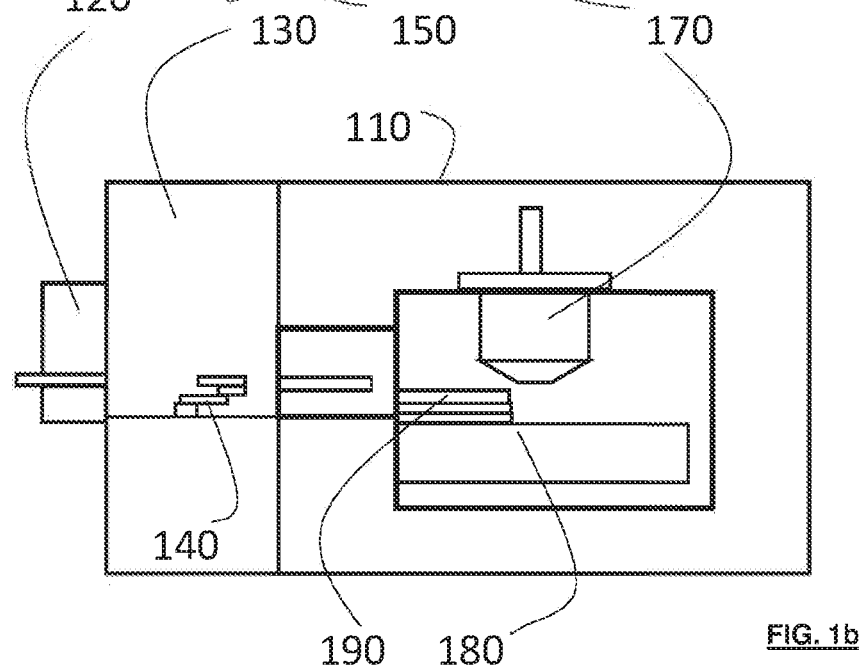

FIGS. 1a and 1b schematically depict a top view and a cross-sectional view of an electron beam (e-beam) inspection (EBI) system 100 which may e.g., be according to some embodiments of the present disclosure. The example as shown comprises an enclosure 110, a pair of load ports 120 serving as an interface to receive objects to be examined and to output objects that have been examined. The example as shown further comprises an object transfer system, referred as an EFEM, equipment front end module 130, that is configured to handle and/or transport the objects to and from the load ports. In the example as shown, the EFEM 130 comprises a handler robot 140 configured to transport objects between the load ports and a load lock 150 of the EBI system 100. The load lock 150 is an interface between atmospheric conditions occurring outside the enclosure 110 and in the EFEM and the vacuum conditions occurring in a vacuum chamber 160 of the EBI system 100. In the example as shown, the vacuum chamber 160 comprises an electron optics system 170 configured to project an e-beam onto an object to be inspected, e.g., a semiconductor substrate or wafer. The EBI system 100 further comprises a positioning device 180 that is configured to displace the object 190 relative to the e-beam generated by the electron optics system 170.

In some embodiments, the positioning device may comprise a cascaded arrangement of multiple positioners such an XY-stage for positioning the object in a substantially horizontal plane, and a Z-stage for positioning the object in the vertical direction.

In some embodiments, the positioning device may comprise a combination of a coarse positioner, configured to provide a coarse positioning of the object over comparatively large distances and a fine positioner, configured to provide a fine positioning of the object over comparatively small distances.

In some embodiments, the positioning device 180 further comprises an object table for holding the object during the inspection process performed by the EBI system 100. In such embodiments, the object 190 may be clamped onto the object table by means of a clamp such as an electrostatic clamp. Such a clamp may be integrated in the object table.

In some embodiments, the positioning device 180 comprises a first positioner for positioning the object table and a second positioner for positioning the first positioner and the object table. In addition, the positioning device 180 as applied in the e-beam inspection tool 100 may comprise a heating device that is configured to generate a heat load in the object table.

Figure 2:
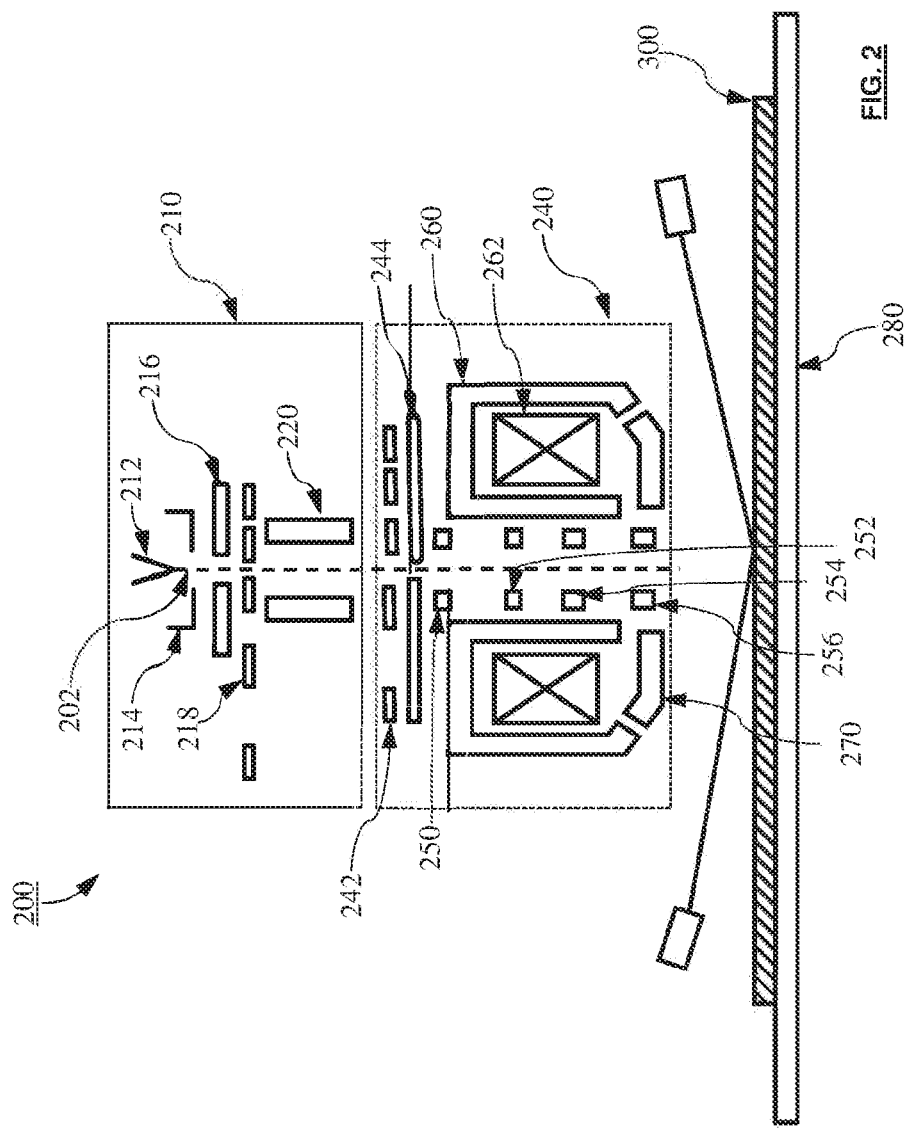
FIGS. 2 and 3 are schematic illustrations of an example electron optical system as can be applied to some embodiments of the present disclosure.

FIG. 2 schematically depict some embodiments of an electron optics system 200 as can be applied in e-beam inspection tool or system according to the present invention. The electron optics system 200 comprises an e-beam source, referred to as the electron gun 210 and an imaging system 240.

The electron gun 210 comprises an electron source 212, suppressor 214, an anode 216, a set of apertures 218, and a condenser 220. The electron source 212 can be a Schottky emitter. More specifically, in some embodiments the electron source 212 includes a ceramic substrate, two source electrodes, a tungsten filament, and a tungsten pin. The two source electrodes are fixed in parallel to the ceramic substrate, and the other sides of the two source electrodes are respectively connected to two ends of the tungsten filament. The tungsten is slightly bended to form a tip for placing the tungsten pin. Next, a ZrO2 is coated on the surface of the tungsten pin and is heated to 1300° C. so as to be melted and cover the tungsten pin but uncover the pinpoint of the tungsten pin. The melted ZrO2 can make the work function of the tungsten lowered and decrease the energy barrier of the emitted electron, and thus the electron beam 202 is emitted efficiently. Then, by applying negative electricity to the suppressor 214, the electron beam 202 is suppressed. Accordingly, the electron beam having the large spread angle is suppressed to the primary electron beam 202, and thus the brightness of the electron beam 202 is enhanced. By the positive charge of the anode 216, the electron beam 202 can be extracted, and then the Coulomb's compulsive force of the electron beam 202 may be controlled by using the tunable aperture 218 which has different aperture sizes for eliminating the unnecessary electron beam outside of the aperture. In order to condense the electron beam 202, the condenser 220 is applied to the electron beam 202, which also provides magnification. The condenser 220 shown in the FIG. 2 may e.g., be an electrostatic lens which can condense the electron beam 202. On the other hand, the condenser 220 can be also a magnetic lens.

Figure 3:
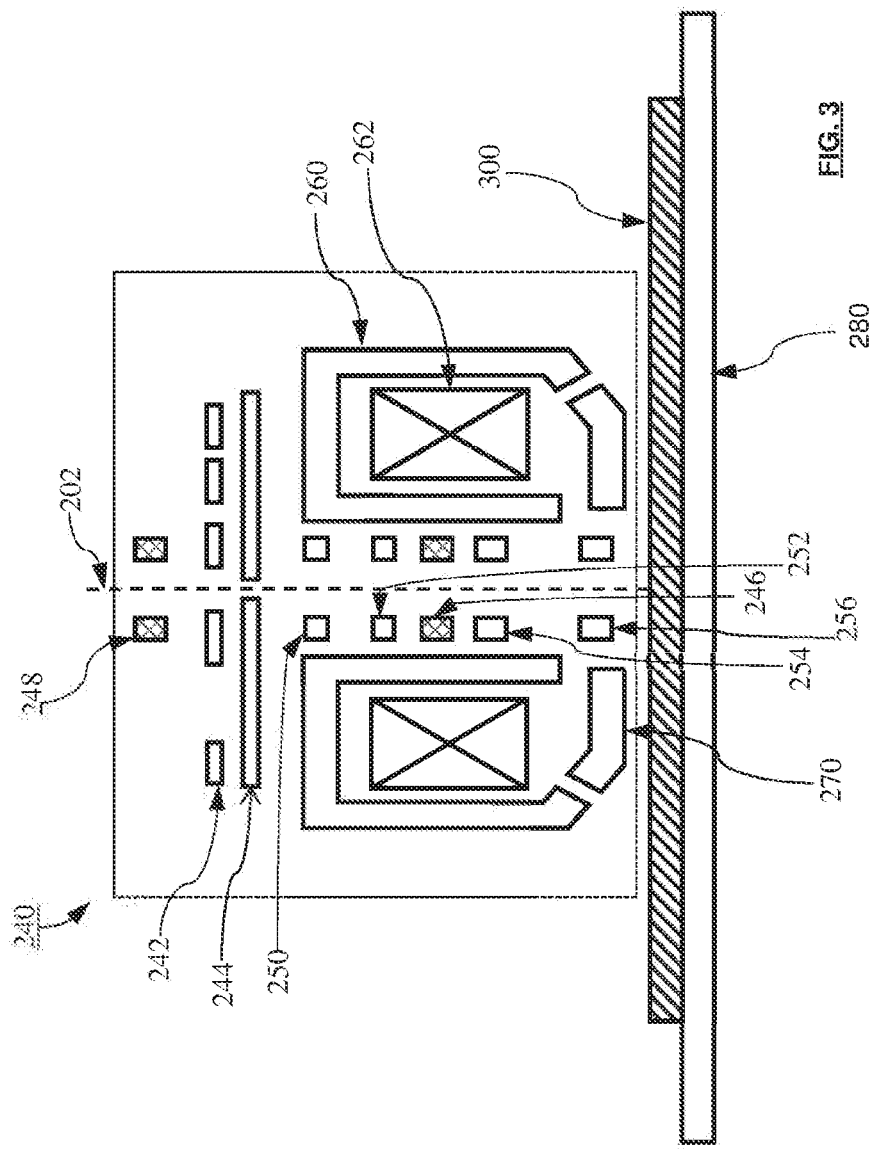

The imaging system 240 as shown in FIG. 3 comprises a blanker 248, a set of apertures 242, a detector 244, four sets of deflectors 250, 252, 254, and 256, a pair of coils 262, a yoke 260, a filter 246, and a lens electrode 270. The lens electrode 270 is used to retard and deflect the electron beam 202, and further has electrostatic lens function due to the combination of upper pole piece and sample 300. Besides, the coil 262 and the yoke 260 are configured to the magnetic objective lens.

The electron beam 202, described above, is generated by heating the electron pin and applying the electric field to anode 216, so that, in order to stabilize the electron beam 202, there must be a long time for heating the electron pin. For a user end, it is surely time consuming and inconvenient. Hence, the blanker 248 is applied to the condensed electron beam 202 for temporally deflecting the electron beam 202 away from the sample rather than turning off it.

The deflectors 250 and 256 are applied to scan the electron beam 202 to a large field of view, and the deflectors 252 and 254 are used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, which immerses the magnetic field into the sample 300. On the other hand, the lens electrode 270 is placed beneath the opening of the yoke 260, and therefore the sample 300 will not be damaged. In order to correct the chromatic aberration of the electron beam 202, the retarder 270, the sample 300, and the upper pole piece form a lens to eliminate the chromatic aberration of the electron beam 202.

Besides, when the electron beam 202 bombards into the sample 300, a secondary electron will be emanated from the surface of the sample 300. Next the secondary electron is directed to the detector 244 by the filter 246.

Figure 4:
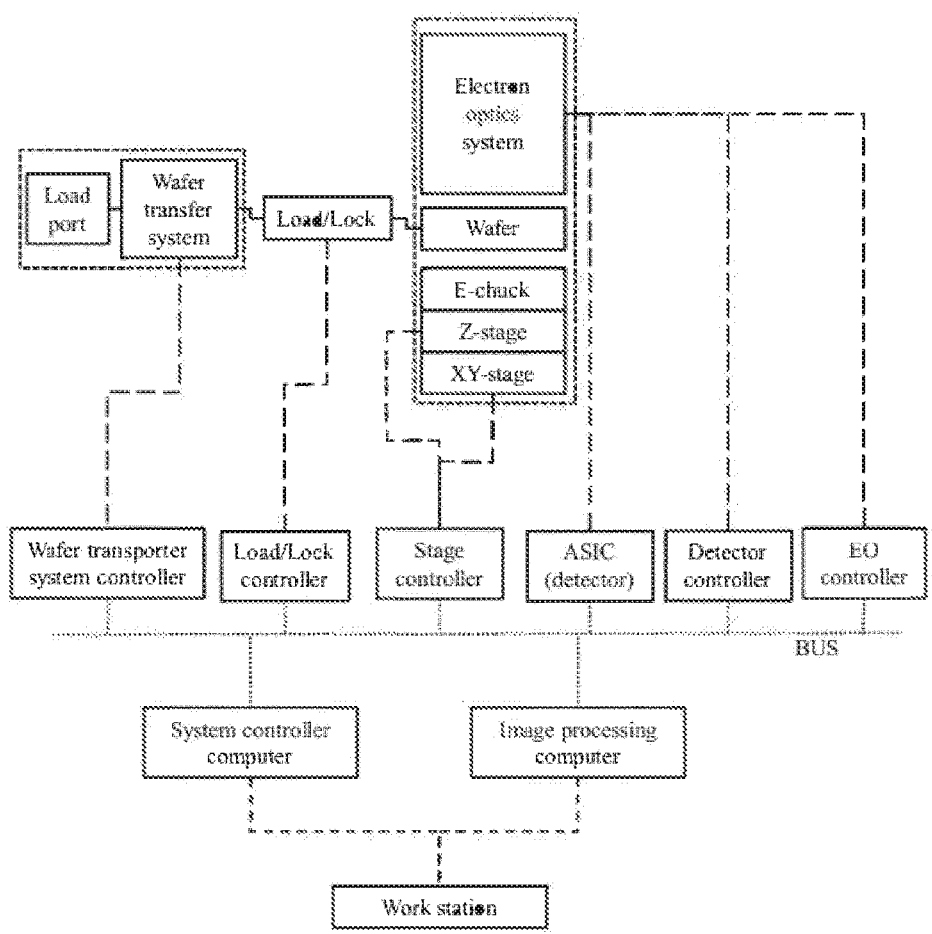
FIG. 4 schematically depicts a possible control architecture of an EBI system according to some embodiments of the present disclosure.

FIG. 4 schematically depicts a possible control architecture of an EBI system according to the present invention. As indicated in FIG. 1, the EBI system comprises a load lock, a wafer transfer system, a load/lock, an electron optics system and a positioning device, e.g., including a z-stage and an x-y stage. As illustrated, these various components of the EBI system may be equipped with respective controllers, i.e., a wafer transporter system controller connected to the wafer transfer system, a load/lock controller, an electron optics controller, a detector controller, a stage controller. These controllers may e.g., be communicatively connected to a system controller computer and an image processing computer, e.g. via a communication bus. In the example as shown, the system controller computer and the image processing computer may be connected to a workstation.

The load port loads a wafer to the wafer transfer system, such as EREM 130, and the wafer transfer system controller controls the wafer transfer to transfer the wafer to the load/lock, such as load lock 150. The load/lock controller controls the load/lock to the chamber, such that an object that is to be examiner, e.g., a wafer can be fixed on a clamp, e.g. an electrostatic clamp, also referred to as an e-chuck. The positioning device, e.g., the z-stage and the x-y stage, enable the wafer to move by the stage controller. In some embodiments, a height of the z-stage may e.g., be adjusted using a piezo component such as a piezo actuator. The electron optic controller may control all the conditions of the electron optics system, and the detector controller may receive and convert the electric signals from the electron optic system to image signals. The system controller computer is to send the commands to the corresponding controller. After receiving the image signals, the image processing computer may process the image signals to identify defects.

As the requirements for the e-beam inspection tool increase, the applied voltage or voltage potential needed to control the emitted electron beam also increases. A higher voltage potential can therefore also be provided to at least some of the (source and/or lens) electrode and deflectors. Whereas in conventional e-beam tools it may be sufficient to charge such components before operation of the e-beam tool, this is not practical for the high voltage potential. Therefore, an electrical connection is used for charging said components and maintaining the components at the desired voltage potential. It is noted that in the context of this invention a higher voltage potential is meant as the absolute value, i.e., it may be a positive or negative voltage.

Figure 5A:
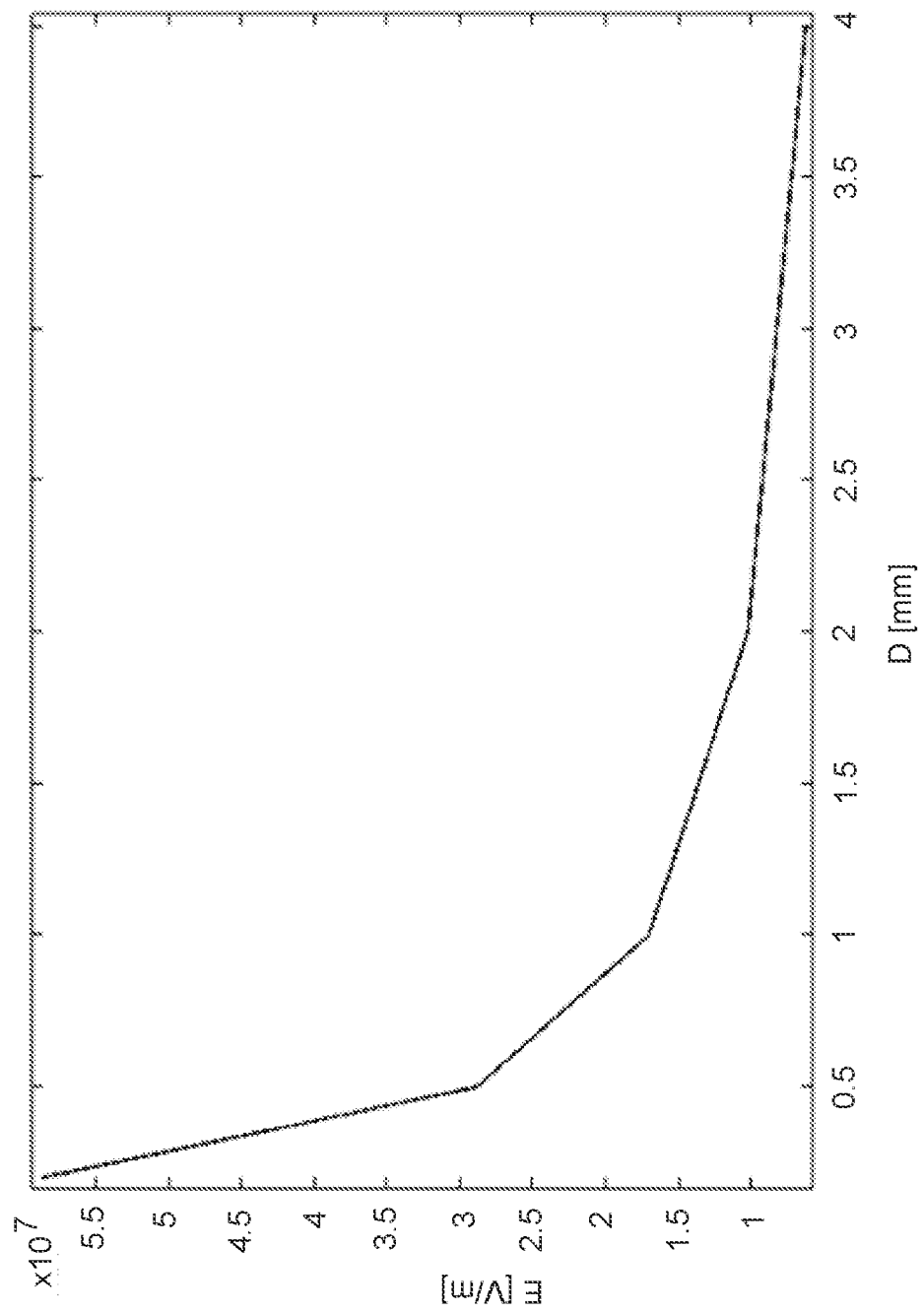
FIG. 5a shows a graph of the electric field intensity generated by a wire as a function of the diameter of the wire.

The electrical connection entails several consequences. Firstly, during use the electrical connection is at the high voltage potential and produces an electric field. Said electric field may affect the correct working of components in the e-beam tool, e.g., electrically chargeable elements such as capacitors. FIG. 5*a* shows a graph of the electric field intensity E at the surface of a wire as a function of the diameter D of the wire. As the diameter D increases, the electric field intensity E decreases. Since the electrical field intensity E at the surface of the wire determines the number of electrons emitted from the wire, said electrical field is preferably low. Thus, from this perspective, the diameter D is preferably chosen as large as possible.

A second consequence of the electrical connection is that it forms a mechanical connection to the object table, affecting any movement of the object table by exerting a force on it during such movement. Said force is dependent on the mechanical stiffness of the electrical connection, which is preferably as small as possible such that the working of the first positioner is distorted as little as possible. For a wire, the mechanical stiffness increases as the diameter D increases. Thus, from this perspective, the diameter D is preferably choses as small as possible.

The above consequences lay conflicting requirements on the design or selection of the electrical connection, which would normally result in a trade-off between the electric field intensity and the mechanical stiffness of the electrical connection. The inventors have found an improvement for this by applying their knowledge of electric fields of conductors. In an electrostatic equilibrium the electric field inside a conductor is zero as all the excess charges are on the outside surface of the conductor. Even if the conductor has non-conducting cavities or voids, e.g., filled with air or vacuum, this holds true. That is, there is no charge in the cavity or on the surface of the conductor surrounding this cavity. The larger the outside surface of the conductor is, the smaller the maximal intensity of the electric field is, as is e.g., illustrated by the reduced electric field intensity E as a function of the larger diameter D in FIG. 5*a*.

Figure 6A:
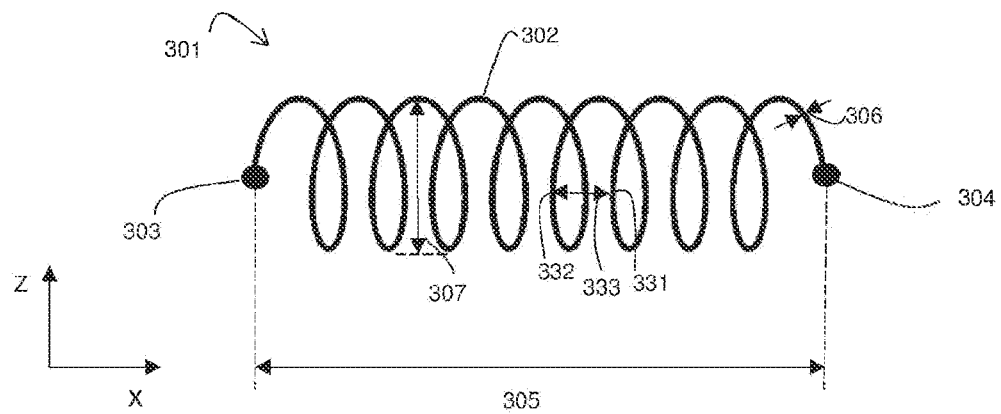

Using this knowledge, numerous arrangements can be designed wherein the electrical connection is arranged such that multiple segments of e.g., a wire or multiple wires of the electrical connection interact with each other so as to behave like a conductor which, for the perspective of the electric field, has a larger diameter than the wire itself, thereby resulting in a reduced maximal electric field intensity. In other words, the electrical connection can be arranged such that wire segments of the wire or wires of the electrical connection are close enough to each other that for the purpose of determining the resulting electric field they can be considered a single conductor with a cavity between said wire segments or wires. Since all conductive substance of the electrical connection is electrically connected, the charges can distribute themselves over the outer surface of the electrical connection to form an electrostatic equilibrium. Meanwhile the diameter of the actual wire can be kept small, thereby maintaining a relatively low mechanical stiffness. An example of such a construction is shown in FIG. 6a, which depicts an electrical connection 301 comprising a wire 302 arranged as a coil comprising loops.

Figure 5B:
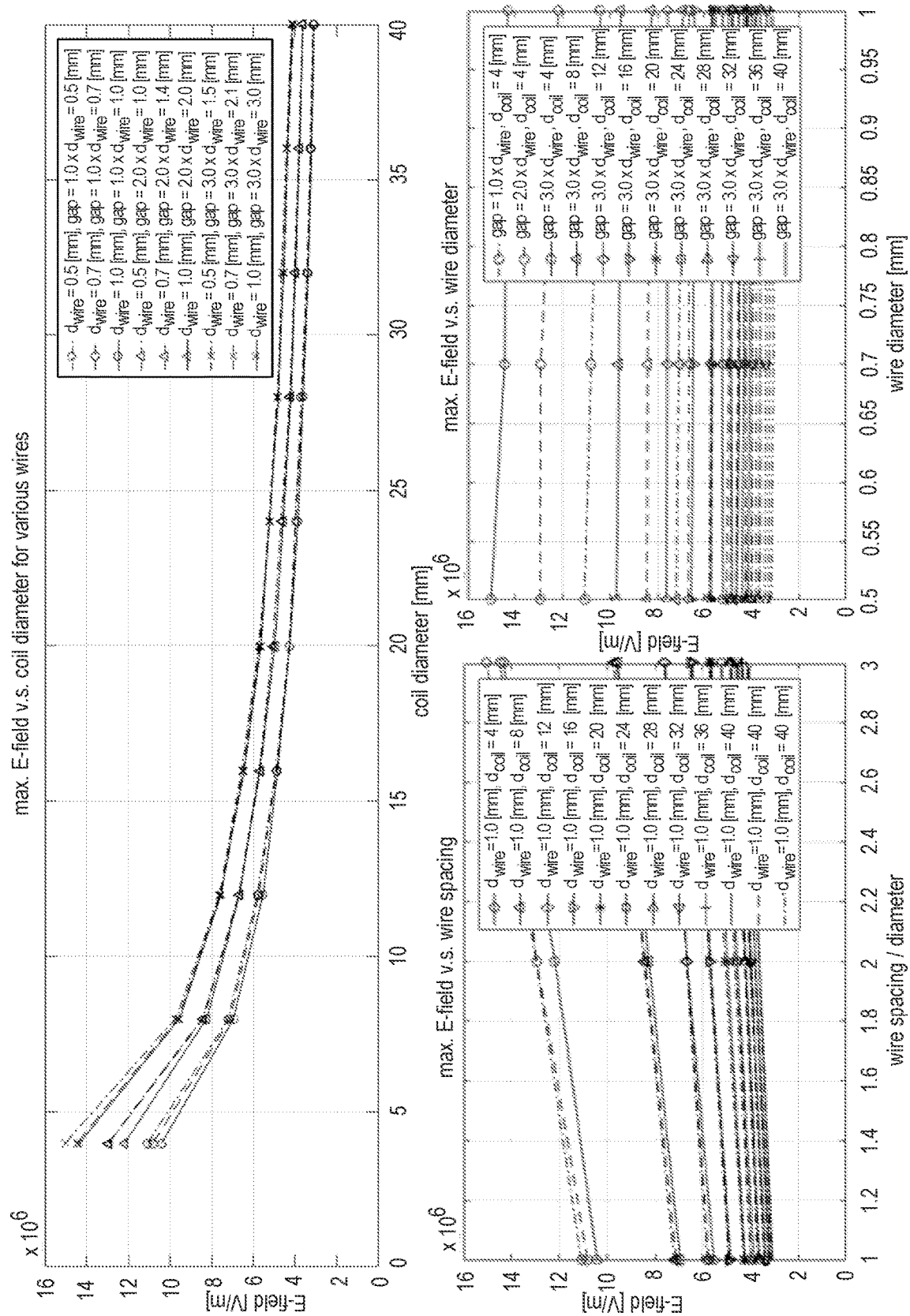
FIG. 5b illustrates the effect of the embodiment shown in FIG. 6a-6e on the electric field intensity.

FIG. 5b shows three graphs illustrate the effect of such an arrangement on the electric field. The upper graph shows the electric field intensity as a function of the diameter of the loops of the coil, the bottom left graph shows the electric field intensity as a function of the ratio of the distance between subsequent loops to the diameter of the wire, and the bottom right graph shows the electric field intensity as a function of the diameter of the wire. As can be seen the maximal intensity of the electric field decreases as the diameter of the loops increases and as the loops are arranged closer to each other. It can further be noted that the diameter of the wire itself has a limited influence on the electric field as long as the ratio of diameter of the loops and the distance between the loops to the wire diameter is kept constant. The diameter of the wire however has a large influence on the mechanical stiffness and can thus advantageously be kept small without affecting the maximal electric field intensity too much in this arrangement.

Furthermore, the inventors have found that it is possible to achieve the same effect of the reduced electric field intensity by using multiple wires as the electrical connection, said multiple wires being arranged close enough to each other and optionally in parallel to each other, and also being on the same or at least substantially the same potential in use. An example of such a construction is shown in FIG. 7a, which depicts an electrical connection 401 comprising six wires 402.1, 402.2, 402.3, 402.4, 402.5, 402.6 arranged in parallel.

The embodiments of the present disclosure relates to an innovative electrical connection, that in particular can be used for a stage apparatus. The innovative electrical connection applies the above explained insight and can be defined or described in different ways, as will be shown with respect to the following figures.

Figure 6B:
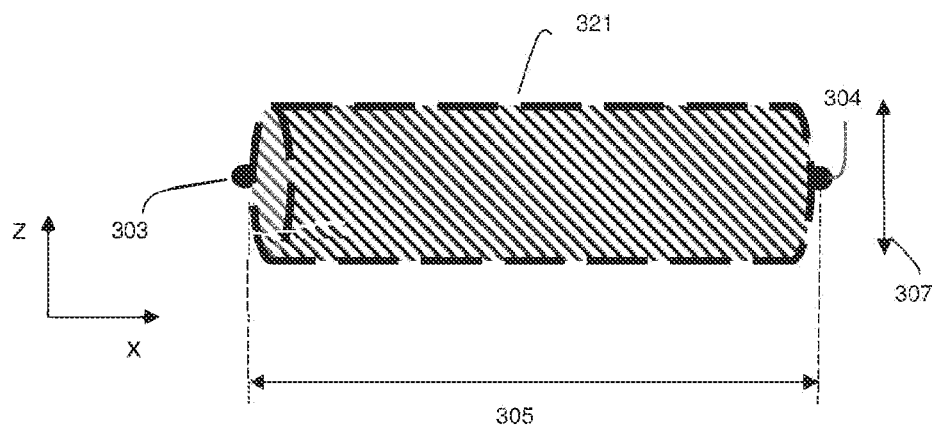

Referring to FIG. 6a, an electrical connection 301 according to the present invention is schematically shown and a first way to describe or define the electrical connection 301 as applied in the present invention is given. The electrical connection 301 comprises a spatial arrangement of a wire 302 having a diameter 306 and spanning a distance 305 in a first direction X between a first end 303 and a second end 304 of the electrical connection 301. The electrical connection 301 is configured to produce, in use, an electric field, which is partly determined by an equivalent electrical diameter 307. In accordance with the present invention, the equivalent electrical diameter 307 is defined by the spatial arrangement of the wire 302, and equals a diameter of an electrically equivalent wire 321, depicted in FIG. 6b, which is arranged straight and spanning the distance 305 in the first direction X. In accordance with the present invention, the electrically equivalent wire 321 is considered to produce an electric field having the same maximal intensity as the electrical field produced by the electrical connection 301, when the same voltage is applied to them. According to some embodiments of the present disclosure, the equivalent electrical diameter 307 is larger than the diameter 306 of the wire 302.

Figure 7A:
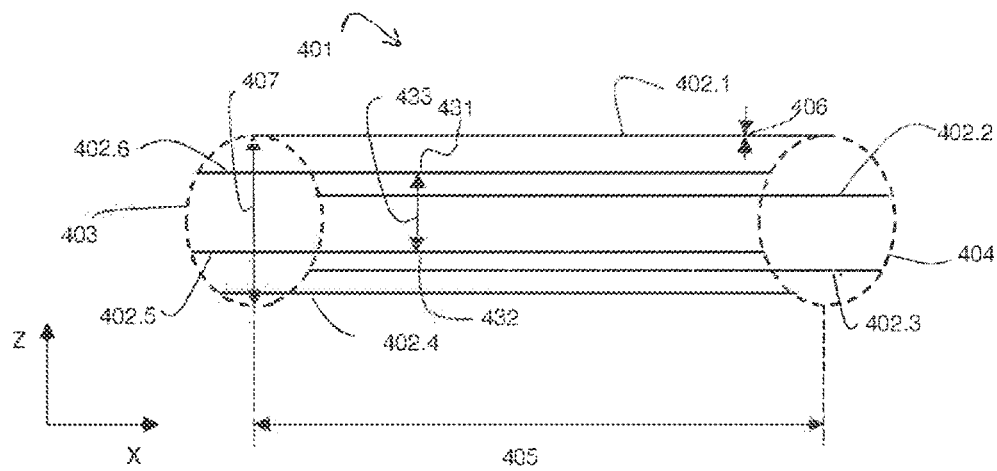
FIG. 7a-7e illustrate another example embodiment of the electrical connection.
Figure 7B:
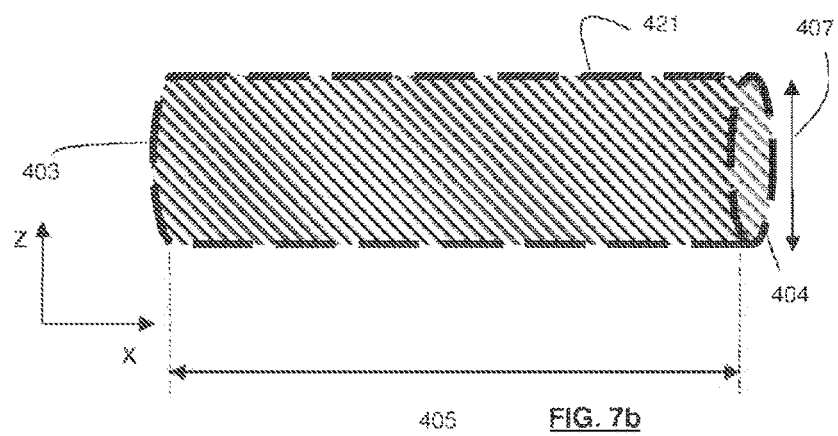

In another example, schematically shown in FIG. 7a, the electrical connection according to the present disclosure may be described as an electrical connection 401 comprising a spatial arrangement of multiple wires 402.1, 402.2, 402.3, 402.4, 402.5, 402.6 having a diameter 406 and spanning a distance 405 in a first direction X, between a first end 403 and a second end 404 of the electrical connection 401. The electrical connection 401 produces, in use, an electric field, which is partly determined by an equivalent electrical diameter 407. In accordance with the present invention, the equivalent electrical diameter 407 is defined by the spatial arrangement of the wires 402.1, 402.2, 402.3, 402.4, 402.5, 402.6, and equals a diameter of an electrically equivalent wire 421, depicted in FIG. 7b, which is arranged straight and spanning the distance 405 in the first direction X. In accordance with the present invention, the electrically equivalent wire 421 is considered to produce an electric field having the same maximal intensity as the electric field of the electrical connection 401, when the same voltage is applied to them. According to the embodiments of the present disclosure, the equivalent electrical diameter 407 is larger than the diameter 406 of the wires 402.1, 402.2, 402.3, 402.4, 402.5, 402.6. It is noted that although in the shown example each of the wires 402.1, 402.2, 402.3, 402.4, 402.5, 402.6 have the same diameter 406, this is not strictly required, or even different diameters for the wires 402.1, 402.2, 402.3, 402.4, 402.5, 402.6 may also be possible.

In the example shown in FIG. 7a the first end 403 and the second end 404 optionally electrically connect the wires 402.1, 402.2, 402.3, 402.4, 402.5, 402.6 such that charges may move from one of the wires 402.1, 402.2, 402.3, 402.4, 402.5, 402.6 to one or other wires 402.1, 402.2, 402.3, 402.4, 402.5, 402.6.

The electrical connection 301, 401, as described above, comprises one or more wires 302, 402.1, 402.2, 402.3, 402.4, 402.5, 402.6 which are arranged such that they interact and form an electric field which has a maximal intensity equal to an electric field that would be produced by an electrically equivalent wire 321, 421 having an equivalent electrical diameter 407, which is larger than the diameter 306, 206 of the one or more wires. Thus, the spatial arrangement of the wires 302, 402.1, 402.2, 402.3, 402.4, 402.5, 402.6 results in a reduced maximal electric field intensity compared to if one wire of the same diameter 306, 406 would be arranged straight between the first end 303, 403 and second end 304, 404. Said maximal electrical field, i.e., the highest intensity of the electrical field, is generally located at a surface of one or more of the wires 302, 402.1, 402.2, 402.3, 402.4, 402.5, 402.6, and may in particular be located at a location which would also correspond with the surface of an electrically equivalent wire 321, 421.

Referring back to FIG. 6a, in some embodiments, the electrical connection 301 further comprises a mechanical stiffness, which represents a force required to compress or stretch the electrical connection 301 for a unit length in the first direction X. As shown in FIG. 6c, an equivalent mechanical diameter 308 is determined, wherein the equivalent mechanical diameter 308 equals a diameter 308 of a mechanically equivalent wire 325 spanning the distance 305 in the first direction X and being arranged substantially straight and spanning the distance 305 in the first direction X, whereby the mechanically equivalent wire 325 would have the same mechanical stiffness as the electrical connection 301. In this example, the equivalent electrical diameter 307 is larger than the equivalent mechanical diameter 308. When the electrical connection 301 comprises exactly one wire 302, the equivalent mechanical diameter 308 is mostly determined by the spatial arrangement of said wire 302.

Figure 7C:
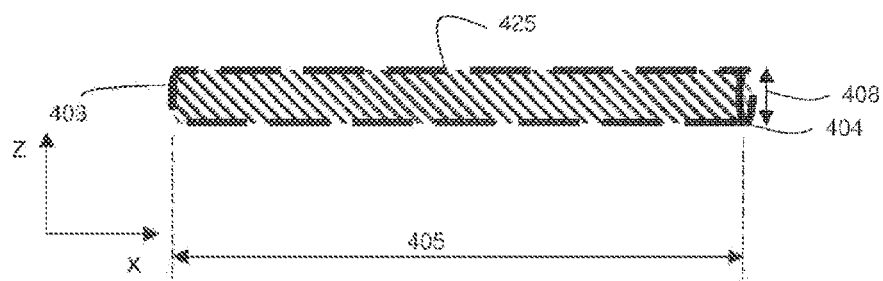

Similarly for the arrangement shown in FIG. 7a, in some embodiments, the electrical connection 401 further comprises a mechanical stiffness, which represents a force required to compress or stretch the electrical connection 401 for a unit length in the first direction X. An equivalent mechanical diameter 408 is determined, which is depicted in FIG. 7c. The equivalent mechanical diameter 408 equals a diameter 408 of a mechanically equivalent wire 425 spanning the distance 405 in the first direction X and being arranged straight and spanning the distance 405 in the first direction X, wherein the mechanically equivalent wire 425 would have the same mechanical stiffness as the electrical connection 401. In this example, the equivalent electrical diameter 407 is larger than the equivalent mechanical diameter 408. When the electrical connection 401 comprises more than one wire 402.1, 402.2, 402.3, 402.4, 402.5, 402.6, the equivalent mechanical diameter is primarily determined by both the diameters 406 and the spatial arrangements of said wires 402.1, 402.2, 402.3, 402.4, 402.5, 402.6.

Advantageously the wire 302 or wires 402.1, 402.2, 402.3, 402.4, 402.5, 402.6 are arranged such that the electrical equivalent diameter 307, 407 is larger than the equivalent mechanical diameter 308, 408. The reduction of the electric field intensity may therefore be of higher impact than a possible increase of the mechanical stiffness.

The mechanical stiffness of each wire 302, 402.1, 402.2, 402.3, 402.4, 402.5, 402.6 is dependent on the diameter, as well as factors such as the spatial arrangement and material. Formulas are known for calculating the stiffness of a wire in most spatial arrangements. To determine the equivalent mechanical diameter when the electrical connection comprises more than one wire, said wires 402.1, 402.2, 402.3, 402.4, 402.5, 402.6 may e.g., be considered as springs in parallel. An equivalent stiffness can then be determined by a summation of the stiffness of each wire 402.1, 402.2, 402.3, 402.4, 402.5, 402.6. However, if a calculation would prove difficult or not practical, the equivalent mechanical stiffness can also be determined empirically with a test-setup, using Hooke's law:

$$k_{eq} = \frac{F}{\Delta x} \quad (1)$$

Wherein F represents the force required the compress or extend the electrical connection by a distance $\Delta x$ from its equilibrium state.

From the equivalent stiffness the equivalent mechanical diameter can be determined. For example, for a straight wire the stiffness can be determined using the following formula:

$$k_{eq} = \frac{E * A_{eq}}{L} \quad (2)$$

Wherein $k_{eq}$ represents the equivalent stiffness, L represents the length of the wire, E represents the Young's modulus and $A_{eq}$ represents an equivalent cross-section area, from which the equivalent diameter can be derived. It is noted that preferably it is assumed that the equivalent mechanical diameter is determined for a wire of the same material, i.e., having the same Young's modulus E as wire or wires used in the electrical connection.

A second way to describe or define the electrical connection 301, 401 as applied in the present invention is given with reference to both FIG. 6a and FIG. 7a. According to this description or definition the electrical connection 301, 401 is defined as comprising one or more wires 302, 402.1, 402.2, 402.3, 402.4, 402.5, 402.6 each having a length and a diameter 306, 406. The wires 302, 402.1, 402.2, 402.3, 402.4, 402.5, 402.6 are arranged such that, in use, for at least, for example, 75%, e.g. at least 80%, 85%, 90%, 95% or 99%, of locations along the length of each wire 302, 402.1, 402.2, 402.3, 402.4, 402.5, 402.6 at least one wire segment of one of the wires 302, 402.1, 402.2, 402.3, 402.4, 402.5, 402.6 is arranged in the vicinity of said location. In accordance with the present invention, the feature of a wire segment being arranged in the vicinity of a wire may e.g. be defined as the wire segment being arranged in a direction perpendicular to the wire 302, 402.1, 402.2, 402.3, 402.4, 402.5, 402.6 at said location at a distance smaller than or equal to, for example, four, five, or six times, e.g. smaller than three, two or one time, the diameter 306, 406 of the wire 302, 402.1, 402.2, 402.3, 402.4, 402.5, 402.6. Preferably, the wire segment which is arranged in the vicinity of the wire 302, 402.1, 402.2, 402.3, 402.4, 402.5, 402.6 is at substantially the same voltage potential as the wire 302, 402.1, 402.2, 402.3, 402.4, 402.5, 402.6.

For example, in FIG. 6a, a location 331 of wire 302 is indicated to illustrate the above definition. For this location 331, there is at least one wire segment 332 in the vicinity in a direction perpendicular to the wire 302 at the location 331. Moreover, the wire segment 332 is arranged at a distance 333 which is smaller than, for example, four, five, or six times the diameter 306 of the wire 302.

For example, in FIG. 7a a location 431 of wire 402.6 is indicated to illustrate the above definition. For this location 431, there is at least one wire segment 432, in this case from wire 402.5, in the vicinity in a direction perpendicular to the wire 402.6 at the location 431. Moreover, the wire segment 432 is arranged at a distance 433 which is smaller than, for example, four, five, or six times the diameter 406 of the wire 402.6. It is noted that for the sake of clarity in FIG. 7a the diameter of the wires 402.1, 402.2, 402.3, 402.4, 402.5, 402.6 and the distance between them may not be on scale.

By arranging the wire 302 or wires 402.1, 402.2, 402.3, 402.4, 402.5, 402.6 such that there is a wire segment 332, 432 in the vicinity of a location 331, 431 of the wire 302 or wires 402.1, 402.2, 402.3, 402.4, 402.5, 402.6, the wire at said location 331, 431 and the wire segment 332, 432 can be considered to cooperate and to form a conductor with a void in between them. They therefore contribute to a resulting electric field which has a smaller maximal intensity than an electric field that would be produced by the wire 302, 402 alone if no other wire segment 332, 432 would be in the vicinity. In other words, the maximal intensity of the electric field is reduced while maintaining the same wire diameter 306, 406, and thus a limited mechanical stiffness.

In practice it may be inconvenient to provide a wire segment in the vicinity of the wire 302, 402.1, 402.2, 402.3, 402.4, 402.5, 402.6 at the first and/or second end of said wire 302, 402.1, 402.2, 402.3, 402.4, 402.5, 402.6 or the first and/or second end of the electrical connection 301, 401, since it may also need to be connected, e.g., to a terminal. Therefore, in some embodiments an electric field shield 1201 may be arranged in the vicinity of the wire 302, 402.1, 402.2, 402.3, 402.4, 402.5, 402.6 and/or electrical connection 301, 401 at such locations. The electric field shield 1201 prevents the electric field produced by wire 302, 402.1, 402.2, 402.3, 402.4, 402.5, 402.6 at such locations to affect components which are behind the electric field shield 1201. The electric field shield 1201 may e.g., be a conductor which may e.g. be grounded.

In some embodiments, for substantially all of the length of each wire 302, 402.1, 402.2, 402.3, 402.4, 402.5, 402.6 at least one wire segment of one of the wires 302, 402.1, 402.2, 402.3, 402.4, 402.5, 402.6 is arranged in the vicinity and/or an electric field shield 1201 is arranged in the vicinity of the wire 302, 402.1, 402.2, 402.3, 402.4, 402.5, 402.6 and/or electrical connection 301, 401. For example, an electric field shield 1201 may be arranged adjacent to the electrical connection 301, 401 at one or more ends of the electrical connection 301, 401 and for the remaining part of the electrical connection 301, 401 for substantially all of the length of each wire 302, 402.1, 402.2, 402.3, 402.4, 402.5, 402.6 at least one wire segment of one of the wires 302, 402.1, 402.2, 402.3, 402.4, 402.5, 402.6 is arranged in the vicinity. It should be clear to the person skilled in the art that an electric field shield 1201 shields the electric field produced by any other shapes of wires e.g., a single straight wire or a series of straight wires. Therefore, the specific shapes of the wires or the electrical connections 301, 401 do not matter for the shielding of the electric fields by the electric field shield. The electric field shield 1201 may be arranged adjacent to one or more ends of the single straight wire or the series of straight wires, and for the remaining part of the single straight wire or the series of straight wires for substantially all of the length of each wire.

Figure 12:
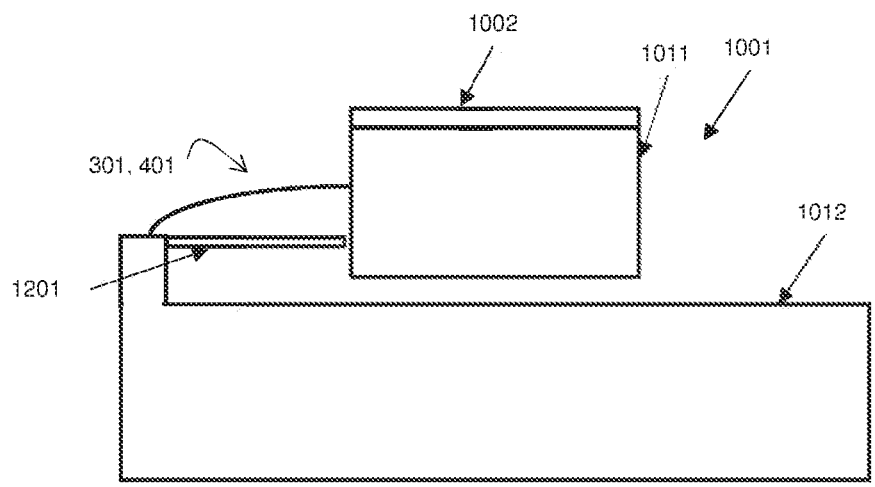
FIG. 12 illustrates an example embodiment of the arrangement of the electric field shield.

In some embodiments, in FIG. 12, the electric field shield 1201 may be arranged between the electrical connection 301, 401 and an object, The electrode may be applied a first voltage by the power source via the electric connection. The object is at a second voltage being different from the first voltage. The electric field shield 1201 arranged between the electrical connection and the object may shield the electric fields and prevent electric discharges or sparks between the electrical connection and the object. The object may, for example, be part of the internal wall of the chamber or part of the long stroke positioner later introduced in this document. The second voltage may be substantially equal to 0, that is electrical ground level, or any other non-zero voltage.

Figure 7D:
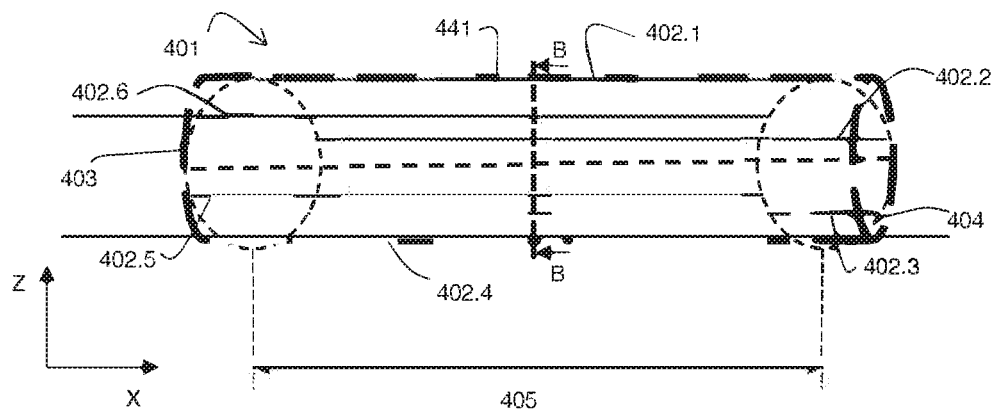

Yet another, third way to describe or define the electrical connection 301, 401 as applied in the present invention, is given with reference to FIG. 6d and FIG. 7d, which show the electrical connections of FIG. 6a and FIG. 7a, respectively. According to this third definition, the electrical connection 301, 401 is defined as comprising an electrically conductive substance, which may e.g. be the wires 302, 402.1, 402.2, 402.3, 402.4, 402.5, 402.6, and spans a distance 305, 405 in a first direction X between a first end 303, 403 and a second end 304, 404. A virtual enveloping volume 341, 441 is defined which comprises substantially all of the electrically conductive substance. Outer parts of the electrical connection define outer borders of the virtual enveloping volume, and the virtual enveloping volume comprises at least one void 341.1, 441.1 having a volume of at least, for example, 1%, 5% or 10% of a volume of the virtual enveloping volume. For each cross-section AA, BB, depicted in FIG. 6e and FIG. 7e respectively, of the virtual enveloping volume 341, 441, a total area of the electrical conductive substance within the cross-section AA, BB is smaller than the area of said cross-section AA, BB. For example, the total area of electrical conductive substance may be smaller than, for example, 99%, 95%, 90%, 75% or 50% of the area of the cross-section AA, BB.

In the shown examples, it is further illustrated that optionally a centerline 342, 442 of the virtual enveloping volume 341, 441 is parallel to the first direction X and the outer borders of a cross section AA, BB, in a plane YZ perpendicular to the first direction X are defined by outer parts of the electrical connection 301, 401.

The virtual enveloping volume 341, 441 may be considered as representing or at least being similar to a conductor corresponding to the electrical connection 301, 401, be it without the voids. In other words, preferably the maximal electric field intensity at the outer surface of the wires 302, 402.1, 402.2, 402.3, 402.4, 402.5, 402.6 equals the electric field intensity at the same location of a conductor which would have the shape of the virtual enveloping volume 341, 441 and would be at the same voltage potential. However, an important difference between the electrical connection 301, 401 and such conductor having the shape of virtual enveloping volume 341, 441 is that the total area of the electrical conductive substance within the cross-section AA, BB is smaller than the area of said cross-section AA, BB. Therefore, the mechanical stiffness of the electrical connection 301, 401 is reduced as compared to such conductor while maintaining the same relatively low maximal intensity of electric field.

It is noted that an arrangement of a single wire 302 as a coil, for example such as the example shown in FIG. 6a-6e, results in a virtual enveloping volume 341 having a void 341.1, but a single straight or slightly bended wire would result in a virtual enveloping volume without a void. It is noted that in the context of this invention microscopic voids that may be present in the material of a wire are to be neglected.

In some embodiments, e.g. wherein the electrical connection 301 comprises a single wire 302, the virtual enveloping volume 341, may further be defined as being larger than the diameter of said wire 302, or optionally larger than, for example, 1.5, 2, or 3 times the diameter, in each direction YZ perpendicular to the first direction X in at least one or optionally all cross-sections in a plane YZ perpendicular to the first direction X. This definition represents that a wire bended in multiple directions is more efficient than e.g., a straight wire or single wire bended only or at least mostly in one direction.

In some embodiments, the virtual enveloping volume 341, 441 can be defined such that any cross-section AA, BB of the virtual enveloping volume 341, 441 in a plane YZ perpendicular to the first direction X has the same shape. The outer borders of the virtual enveloping volume 341, 441 is the perpendicular plane YZ are defined by the outer parts of the electrical connection in that direction at any point in the first direction X.

For example, in the example shown in FIG. 6d-6e, the electrical connection 301 comprises a single wire 302 which is comprises a plurality of curves between the first end 303 and the second end 304 of the electrical connection 301, the single wire 302 thereby deviating from the first direction X in a plurality of directions perpendicular to the first direction X. The outer borders of the virtual enveloping volume 341 in such embodiments correspond in each cross-section AA in the plane ZY in each direction with the furthest the single wire 302 deviates from the centerline 342 in said direction anywhere in the electrical connection 301. In the shown example, the cross-section AA is a circle since according to this definition the wire 302 is arranged in circular loops.

In the cross-section AA shown in FIG. 6e the wire 302 is depicted circular for simplicity. However, it is noted that in practice, depending on how close to each other the loops of the electrical connection 301 are arranged, the wire 302 in such cross section may have a more elongated shape.

Figure 7E:
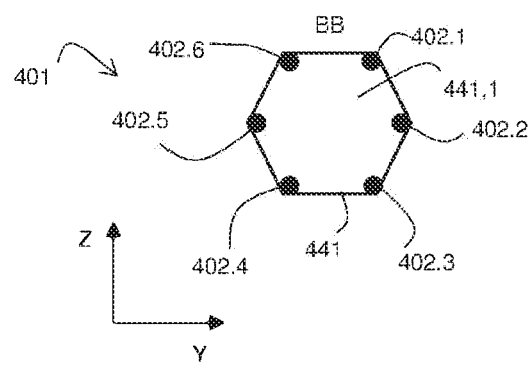

In some embodiments, e.g., the example shown in FIG. 7d-7e, the electrical connection 401 comprises a plurality of parallel wires 402.1, 402.2, 402.3, 402.4, 402.5, 402.6 which are not arranged in a single plane. The virtual enveloping volume 441 may then be defined such that a cross-section BB of the virtual enveloping volume 441 in a plane XY perpendicular to the first direction X has a polygonal shape, wherein outer wires 402.1, 402.2, 402.3, 402.4, 402.5, 402.6 of the plurality of wires 402.1, 402.2, 402.3, 402.4, 402.5, 402.6 form the corners of the polygonal and the sides of the polygonal are defined by connecting said outer wires 402.1, 402.2, 402.3, 402.4, 402.5, 402.6 with straight line segments. In the shown example, the number of corners and sides of the polygonal corresponds with the numbers of wires, i.e., six, because all of the wires 402.1, 402.2, 402.3, 402.4, 402.5, 402.6 are arranged as outer wires. It is noted however that is also possible that one or more wires are arranged within the polygonal, e.g., in the center.

In yet another, fourth, way to describe or define the electrical connection as applied in the present invention, reference is again made to FIG. 6a and FIG. 7a. The electrical connection 301, 401 comprises one or more wires 302, 402.1, 402.2, 402.3, 402.4, 402.5, 402.6 having a diameter 306, 406 and spanning a distance 305, 405 between a first end 303, 403 and a second end 304, 404 of the electrical connection 301, 401, wherein the electrical connection 301, 401 is arranged such that the maximal electric field intensity generated by it is smaller than the electric field intensity generated by a straight wire of the same diameter 306, 406 and spanning the same distance 305, 405.

For example, in the arrangement of FIG. 6a, the wire 302 is arranged with loops, such that the different parts of the loop and/or subsequent loops affect each other and together form or generate the electric field. As a result of this interaction, the maximal electric field intensity is smaller than if the wire 302 would be a straight wire which is at the same voltage potential.

For example, in the arrangement of FIG. 7a, the multiple wires 402.1, 402.2, 402.3, 402.4, 402.5, 402.6 interact with each other for forming the electric field. As a result, the average and maximal electric field intensity is smaller than if the electrical connection 401 would be a single straight wire.

For some embodiments, e.g., the example shown in FIG. 6a, a fifth way to describe or define the electrical connection as applied in the present invention can be used. According to this fifth definition, the electrical connection 301 comprises at least one wire 302 comprising a plurality of loops between a first end 303 and a second end 304 of the electrical connection 301, the plurality of loops being arranged substantially parallel to each other, such that, during use, corresponding portions 331, 332 of adjacent loops are spaced apart over a distance 333 smaller than or equal to, for example, four, five, six times a diameter 306 of the wire 302, e.g. smaller than three, two or one time the diameter 306.

For some embodiments, e.g., the example shown in FIG. 7a, a sixth way to describe or define the electrical connection as applied in the present invention can be used. According to the sixth definition the electrical connection 401 comprises a plurality of wires 402.1, 402.2, 402.3, 402.4, 402.5, 402.6 arranged as a bundle connector and not a arranged in a single plane, a nominal distance 433 between adjacent wires 402.5, 402.6 of the bundle connector being smaller or equal to, for example, four, five or six times the diameter 406 of the wires 402.5, 402.6, e.g. smaller than three, two or one time the diameter 406.

The fifth and sixth way to define the electrical connection as used in the present invention reflect that by arranging the wire 302 or wires 402.1, 402.2, 402.3, 402.4, 402.5, 402.6 such that there is another part of the wire 302 or another wire 402.1, 402.2, 402.3, 402.4, 402.5, 402.6 in the vicinity, they can be considered to form a conductor with a cavity in between them. They therefore both contribute to a resulting electric field which has a smaller maximal intensity than an electric field that would be produced by the wire 302, 402.5 alone. In other words, the maximal intensity of the electric field is reduced while maintaining the same wire diameter 306, 406, and thus a limited mechanical stiffness.

Figure 8A:
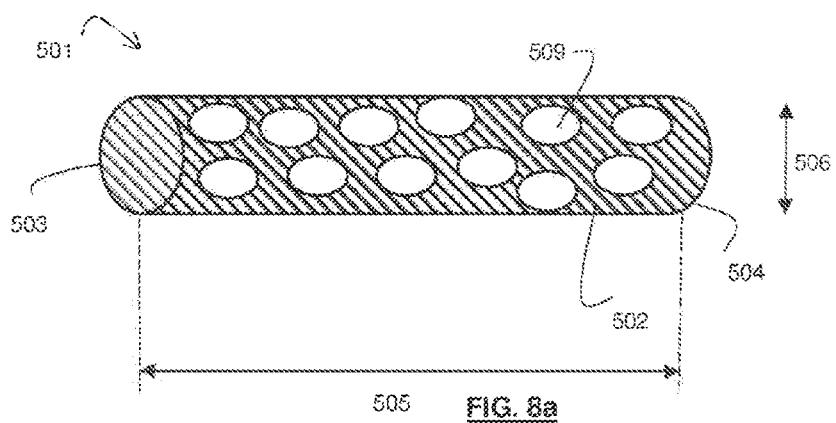
FIG. 8a-8c illustrate another example embodiment of the electrical connection.
Figure 8B:
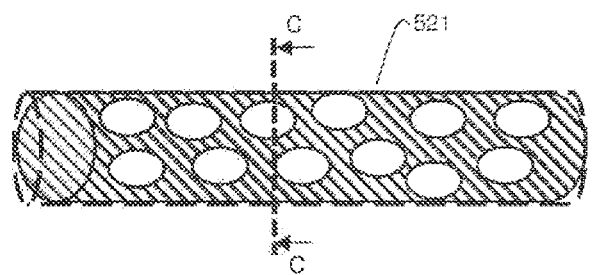
Figure 8C:
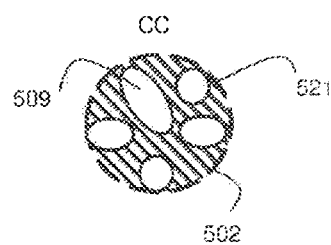

FIG. 8a-8c show another example of the electrical connection as applied in the present invention, which may be described or defined in the following way. In this example an electrical connection 501 comprises a cylinder made of electrically conductive substance 502, and comprising a plurality of apertures 509. For example, the total volume of the apertures 509 may be at least, for example, 1, 5, or 10% of the volume of the cylinder. It is noted that in the context of this invention microscopic apertures that may be present in the material of the electrically conductive substance 502 should be ignored. In a further example the cylinder may be hollow having a surface area made of the conductive substance 502.

It is noted however that the electrical connection shown in FIG. 8a can also be defined in alternative ways. For example, in FIG. 8b a virtual enveloping volume 521 is shown, and in FIG. 8c a cross-section CC thereof is depicted. As can be seen, a total area of the electrically conductive substance 502 within the cross-section CC is smaller than an area of said cross-section CC.

The apertures 509 in the example shown in FIG. 8a-8c advantageously reduce the mechanical stiffness of the electrical connection 501 without increasing the maximal electric field intensity.

It is noted that although herein described separately, each of the above disclosed ways to describe or define of the electrical connection may also be combined with each other to define the electrical connection.

In some embodiments, e.g., as shown in FIG. 6a-6e, wherein the electrical connection 301 comprises a wire 302 comprising loops, a loop diameter 307 is between, for example, three and six times the diameter 306 of the wire 302, e.g. between four and five times the diameter 306. The larger the loop diameter 307, the more the said maximal intensity of the electric field is reduced. However, at the same time there may be practical limitations with regard to the available space. The loop diameter 307 being between, for example, three and six times the diameter 306 of the wire 302 accomplishes both requirements.

In some embodiments, e.g., as shown in FIG. 7a-7e, wherein the electrical connection 401 comprises a plurality of wires 402.1, 402.2, 402.3, 402.4, 402.5, 402.6 arranged as a bundle connector, the bundle connector comprises at least four parallel wires. In the shown example, the bundle connector comprises six parallel wires 402.1, 402.2, 402.3, 402.4, 402.5, 402.6.

In some embodiments, e.g., as shown in FIG. 7a-7e, wherein the electrical connection 401 comprises a plurality of wires 402.1, 402.2, 402.3, 402.4, 402.5, 402.6 arranged as a bundle connector, the first ends and second ends of the plurality of wires 402.1, 402.2, 402.3, 402.4, 402.5, 402.6 are arranged on a circular circumference. In FIG. 7a said circular circumference corresponds with the first end 403 and the second end 404 of the electrical connection 401.

Optionally the wires 402.1, 402.2, 402.3, 402.4, 402.5, 402.6 are arranged equidistantly on said circular circumferences.

Figure 9:
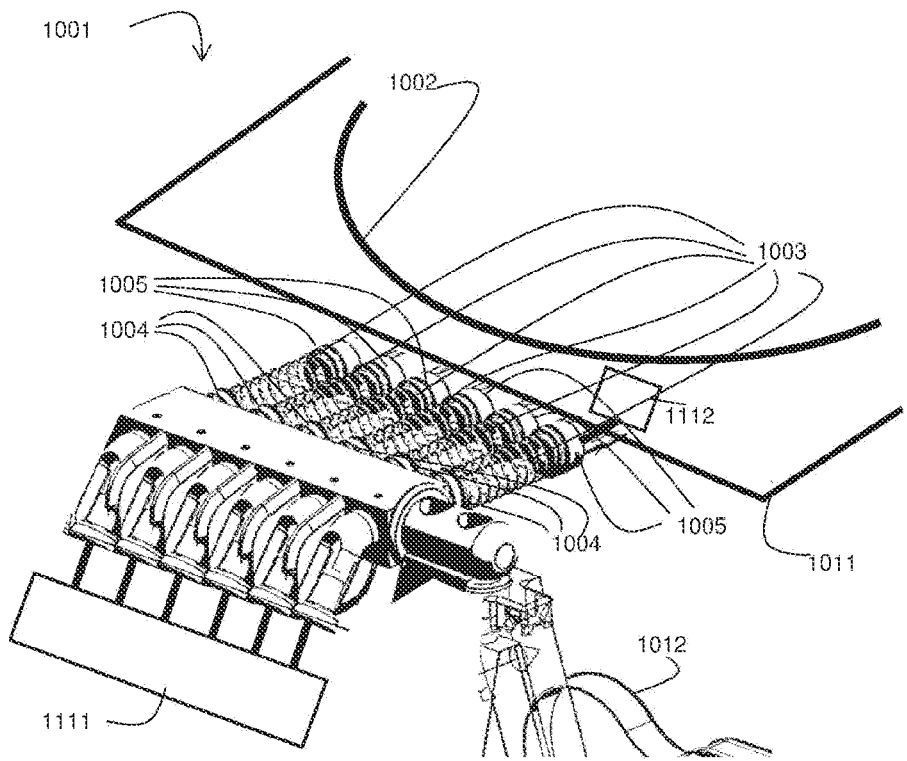
FIG. 9 depicts a stage apparatus, according to some embodiments of the present disclosure.

FIG. 9 depicts a part of a stage apparatus 1001 according to some embodiments of the present disclosure. The stage apparatus 1001 comprises an object table 1002 configured to hold an object, which may e.g., be a substrate. The object table 1002 comprises a schematically shown electrode 1112 configured to be charged by a schematically shown power source 1111, and an electrical connection 1003 configured to be connected to a first terminal 1005 that is electrically connected to the electrode to be connected to a second terminal 1004 that electrically connected to the power source. According to some embodiments of the present disclosure, the electrical connection 1003 is an example of the innovative electrical connection, of which several examples are described herein. In the shown example, the electrical connection 1003 comprises a plurality of loops similar to the example described with respect to FIGS. 6a-6e.

Referring back to FIG. 9, in some embodiments the electrode 1112 is configured to be charged to at least −100 V, −1 kV, −10 kV, or −100 kV. The electrical connection 1003 is configured to be at the same voltage potential during use. The larger the voltage potential on which electrical connection 1003 is, the larger the electric field intensity produced by it. Therefore, it becomes more important to reduce said electric field intensity as much as possible by using the electrical connection 1003 according to the present invention.

In some embodiments the stage apparatus 1001 comprises a positioner comprising a first positioning module 1011 and a second positioning module 1012. The first positioning module 1011 is configured to position the object table 1002, and the second positioning module 1012 is configured to position the object table 1002 and the first positioning module 1011. The electrical connection 1004 forms a connection between the first positioning module 1011 and the second positioning module 1012. The first positioning module 1011 may e.g., correspond with the first positioner and the second positioning module with the second positioner of the positioning device 180 shown in FIG. 1. The first positioning module 1011 may also be referred to as a short-stroke module and the second positioning module 1012 may also be referred to as a long-stroke module.

Referring back to FIG. 9, the first positioning module 1011 is preferably able to position the object table 1002 as precisely as possible, as independently as possible from the second positioning module 1012. The connection formed by the electrical connection 1004 should therefore have a low mechanical stiffness, which is provided by the electrical connection 1003 according to some embodiments of the present disclosure.

In a further example the object table 1002 is arranged in the first positioning module 1011 and the power source is arranged in the second positioning module 1012.

In some embodiments, the stage apparatus 1001 comprises at least one further electrical connection 1003 embodied similarly to the electrical connection 1003. In the shown example the stage apparatus 1001 comprises six similar electrical connections 1003. Optionally each of the electrical connections 1003 is configured to charge another electrode (not shown in FIG. 9), and/or one or more of the electrical connections 1003 may be on a mutually different voltage potential during use.

Figure 10:
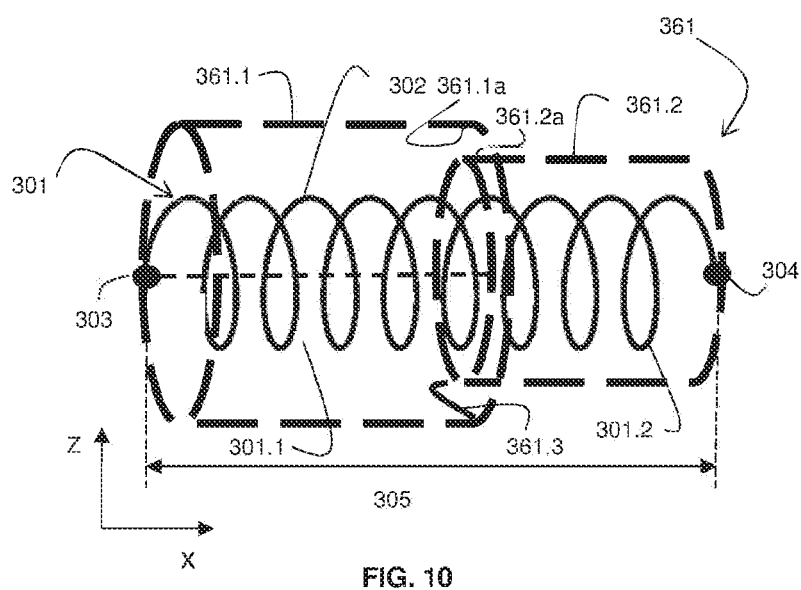
FIG. 10 illustrates an example embodiment of an electric field shield.

FIG. 10 illustrates an example embodiment wherein the stage apparatus further comprises an optional electric field shield 361 for shielding at least a part of the electrical connection 301, which may e.g., be arranged adjacent to at least a part of the electrical connection 301, which in the shown example is the electrical connection 301 as also depicted in FIGS. 6a-6e. The electric field shield 361 prevents the electric field produced by the electrical connection 301 to affect components which are behind the electric field shield 361. The electric field shield 361 may e.g., be a conductor which may e.g. be grounded.

In the shown example the electric field shield 361 comprises a first surrounding volume 361.1 surrounding a first part 301.1 of the electrical connection 301 including the first end 303 and a second surrounding volume 361.2 surrounding a second part 301.2 of the electrical connection 301 including the second end 304. In the shown example an outer surface 361.2a of at least a part of the second surrounding volume 361.2 is smaller than an inner surface 361.1a of at least a part of the first surrounding volume 361.1, said parts of the first 361.1 and second surrounding volume 361.2 being configured be radially adjacent thereby allowing axial movement of the first 361.1 and second surrounding volume 361.2 relative to each other. In an alternative example, an inner surface of the at least part of the second surrounding volume 361.2 could be larger than an outer surface of the at least part of the first surrounding volume 361.1.

In the shown example, the first 361.1 and second surrounding volume 362.2 are electrically coupled to each other, in the shown example via a conductive flexible wire 361.3, and at least one of the first 361.1 and second surrounding volume 362.2 may e.g., be grounded. However, it is also possible to electrically connect the first surrounding volume 361.1 to the first end 303 and/or the second surrounding volume 361.2 to the second end 304, with or without the conductive flexible wire 361.3.

In this example, the electrical connection 301 is completely surrounded by the electric field shield 361 at all times, while still allowing movement of one end of the electrical connection relative to the other, since the first 361.1 and second surrounding volume 361.2 are able to move relative to each other in the axial direction X.

Figure 11A:
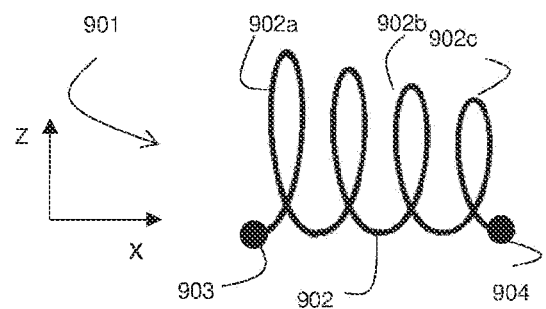
FIG. 11a illustrates another example embodiment of the electrical connection.

In the shown example, the first 361.1 and second surrounding volume 361.2 are shaped as hollow cylinders. However other arrangements are possible. For example, the second surrounding volume 361.2 may be partly shaped as a hollow cylinder of the same radial size as the first surrounding volume 361.1, but with a narrowing portion where the first 361.1 and second surrounding volume 361.2 overlap. Another example is that the electric field shield 361 comprises only the first surrounding volume 361.1 extending through almost the entire length of the electrical connection 301 with some gap at one end of the electrical connection 301, thus substantially surrounding both the first part 301.1 and the second part 301.2, but still does not introduce a stiff connection between the first end 303 and the second end 304, and allows the relative movement between the first end 303 and the second end 304. FIG. 11a further shows an example embodiment of the electrical connection 901 wherein the plurality of loops comprises at least a first loop 902a, a second loop 902b, and a third loop 902c, wherein the first loop 902a is arranged closest to the first end 903 among the first 902a, second 902b and third loops 902c. The third loop 902c is arranged closest to the second end 904 among the first 902a, second 902b and third loops 902c. The second loop 902b is arranged between the first loop 902a and the third loop 902c, the plurality of loops are arranged in an increasing diameter arrangement in which the first loop 902a has a smaller diameter than the second loop 902b and the second loop 902b has a smaller diameter than the third loop 902c. Alternatively the plurality of loops could arranged in a decreasing diameter arrangement in which the first loop 902a has a larger diameter than the second loop 902b and the second loop 902b has a larger diameter than the third loop 902c.

Figure 11B:
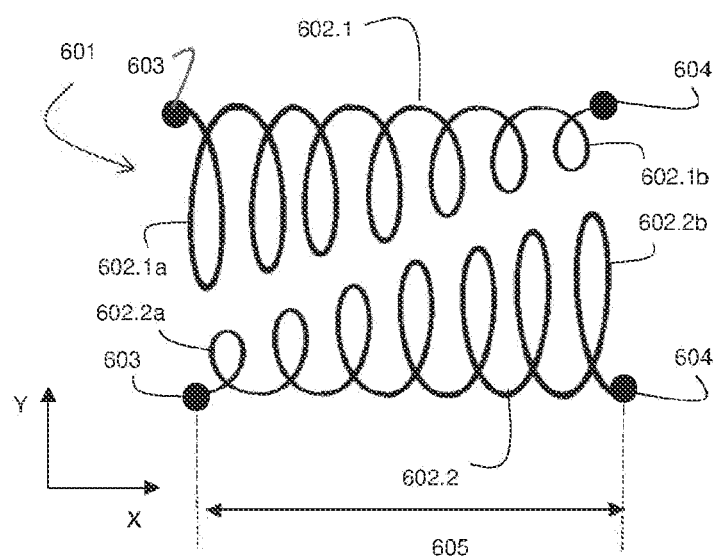
FIG. 11b illustrates another example embodiment of the electrical connection.

FIG. 11b shows an another example embodiment of an electrical connection 601 according to the present disclosure, which in this case comprises a wire 602.1 arranged in a coil shape comprising a plurality of loops of which a first loop 602.1a and a second loop 602.1b are indicated by reference numerals in FIG. 11b. Optionally a diameter of the first loop 602.1a is different from a diameter of the second loop 602.b, e.g. the plurality of loops include loops that have a mutually different diameter, and further optionally the diameter of the loops increases or decreases monotonically when seen in a first direction X between a first end 603 and a second end 604 of the electrical connection 601. For example, in the shown example, the first loop 602.1a has a larger diameter than the second loop 602.1b, and the diameter decreases when seen in the first direction X.

In the shown example, the electrical connection 601 further comprises an optional second wire 602.2 arranged in a coil shape comprising a plurality of loops wherein the diameter of the loops increases or decreases monotonically when seen in the first direction X. In particular, wires 602.1, 602.2 arranged adjacent to each other in a direction Y perpendicular to the first direction X alternately have loops with monotonically increasing and decreasing diameter. Thus, in the shown example, wire 602.1 has loops with decreasing diameter and wire 602.2 has loops with increasing diameter. By arranging the wires 602.1, 602.2 like this, they can be placed closer to each other in the direction Y and as such consume less space. It is noted that it is also possible to provide two electrical connections comprising each one wire arranged similarly as the two wires 602.1, 602.2 of the electrical connection 601 shown in FIG. 11b.

In other words, the electrical connection 601 comprises a plurality of wires 602.1, 602.2 arranged in a coil shape comprising a plurality of loops arranged in the increasing arrangement or the decreasing arrangement wherein wires arranged adjacent to each other in a direction Y substantially perpendicular to the first direction X alternately are arranged in the increasing arrangement and decreasing arrangement. It is noted that the same effect could be achieved by a plurality of electrical connections arranged adjacent to each other, each comprising at least one wire arranged in a coil shape comprising a plurality of loops arranged in increasing diameter or decreasing diameter arrangement.

Figure 11C:
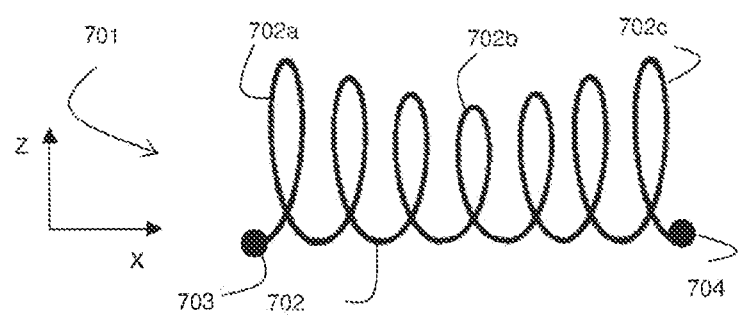
FIG. 11c illustrates another example embodiment of the electrical connection.

FIG. 11c shows another example of the electrical connection 701 wherein the plurality of loops comprises at least a first loop 702a, a second loop 702b, and a third loop 702c. The first loop 702a is arranged closest to the first end 103 among the first, second and third loops. The third loop 702c is arranged closest to the second end 704 among the first, second and third loops. The second loop 702b is arranged between the first loop 702a and the third loop 702c and the second loop 702b has a smaller diameter than the first loop 702a and than the third loop 702c.

Figures 11D, 11E, 11F:
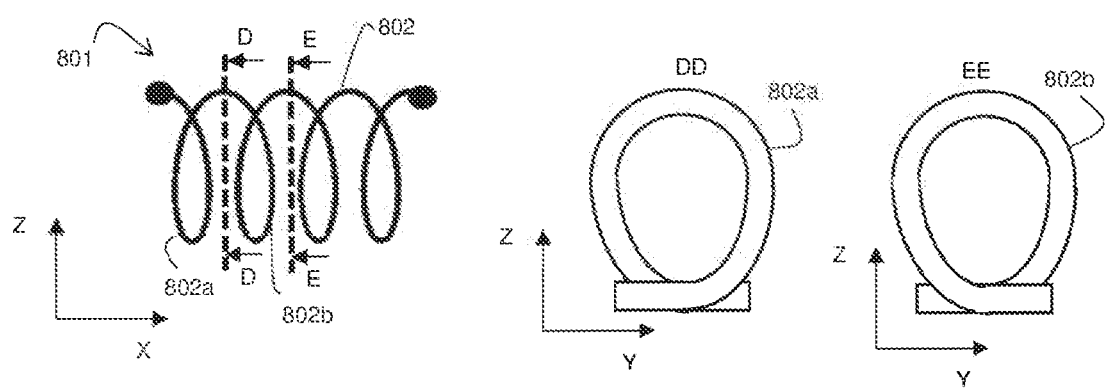
FIG. 11d-f illustrate another example embodiment of the electrical connection.

FIG. 11d-1 if illustrate an example embodiment of the electrical connection 801 wherein at least one loop 802a of the plurality of loops is wound in an opposite direction compared to at least one other loop 802b of the plurality of loops. This is illustrated in the cross-sections DD, EE depicted in FIG. 11e and FIG. 11f, respectively. By having the loops 802a, 802b curved in opposite directions, a magnetic field generated when current flows through wire 802 is opposite for each loop 802a, 802b. Said magnetic fields therefore at least partially cancel each other and the resulting magnetic field is reduced, thereby reducing the risk of affecting other surrounding components, e.g., in the stage apparatus or e-beam inspection tool.

In some embodiments, the electrical connection according to the present disclosure may comprise one or more wires which have a non-circular cross-section. For example, said wires may have an elliptical cross-section, e.g., being longer along a tangent of an outer surface of the electrical connection.

In some embodiments, one or more wires, e.g., being coil shaped, of the electrical connection, may be pre-tensioned. This may reduce unwanted deflection, e.g., sideways, when accelerations take place, and increases the frequency of traversal resonance modes.

Further embodiments may be described in the following clauses:

1. Stage apparatus comprising an object table configured to hold a substrate, the object table comprising an electrode configured to be charged by a power source and an electrical connection configured to connect a first terminal electrically connected to the electrode to a second terminal electrically connected to the power source, which electrical connection comprises a spatial arrangement of one or more wires having a diameter, and spanning a distance in a first direction between a first end and a second end of the electrical connection, is configured to produce, in use, an electric field, which is partly determined by an equivalent electrical diameter which is defined by the spatial arrangement of the one or more wires, and equals a diameter of an electrically equivalent wire when arranged substantially straight and for spanning the distance in the first direction, wherein the electrically equivalent wire would produce an electric field having the substantially same maximal intensity, wherein the equivalent electrical diameter is larger than any diameter of the one or more wires.

2. Stage apparatus according to clause 1, wherein the electrical connection further comprises a mechanical stiffness, which represents a force required to compress or stretch the electrical connection for a unit length in the first direction, for which an equivalent mechanical diameter is determined, wherein the equivalent mechanical diameter equals a diameter of a mechanically equivalent wire when arranged substantially straight and for spanning the distance in the first direction and wherein the mechanically equivalent wire would comprise the same mechanical stiffness as the electrical connection, wherein the equivalent electrical diameter is larger than the equivalent mechanical diameter.

3. Stage apparatus comprising an object table configured to hold a substrate, the object table comprising an electrode configured to be charged by a power source and an electrical connection configured to connect a first terminal electrically connected to the electrode to a second terminal electrically connected to the power source, wherein the electrical connection comprises one or more wires each having a length and a diameter, arranged such that, in use, for at least 75%, 80%, 85%, 90%, 95%, or 99% of locations along the length of each wire at least one wire segment of one of the wires is arranged in the vicinity of said location of the wire, wherein being arranged in the vicinity is defined as being arranged in a direction perpendicular to the wire at said location at a distance smaller than or equal to 4, 5, or 6 times the diameter of the wire.

4. Stage apparatus comprising an object table configured to hold a substrate, the object table comprising an electrode configured to be charged by a power source and an electrical connection configured to connect a first terminal electrically connected to the electrode to a second terminal electrically connected to the power source, wherein the electrical connection
comprises an electrically conductive substance, and spans a distance in a first direction between a first end and a second end of the electrical connection,
wherein the electrical connection further comprises a virtual enveloping volume being defined to comprise substantially all the electrical conductive substance, wherein
outer parts of the electrical connection define outer borders the virtual enveloping volume, and
the virtual enveloping volume comprises at least one void having a volume of at least 1%, 5% or 10% of a volume of the virtual enveloping volume
wherein, for each cross-section of the virtual enveloping volume, a total area of the electrically conductive substance within the cross-section is smaller than an area of said cross-section.

5. Stage apparatus according to clause 4, wherein the virtual enveloping volume is defined such that any cross-section of the virtual enveloping volume in a plane perpendicular the first direction has the same shape.

6. Stage apparatus according to clause 4 or clause 5, wherein the electrical connection comprises a plurality of parallel wires which are not arranged in a single plane, wherein the virtual enveloping volume is defined such that a cross-section of the virtual enveloping volume in a plane perpendicular to the first direction has a polygonal shape, wherein outer wires of the plurality of wires form the corners of the polygonal and the sides of the polygonal are defined by connecting said outer wires with straight line segments.

7. Stage apparatus comprising an object table configured to hold a substrate, the object table comprising an electrode configured to be charged by a power source and an electrical connection configured to connect a first terminal electrically connected to the electrode to a second terminal electrically connected to the power source,
wherein the electrical connection comprises one or more wires having a diameter and spanning a distance between a first end and a second end of the electrical connection, and wherein the electrical connection is arranged such that the maximal electric field intensity generated by the electrical connection is smaller than the maximal electric field intensity generated by a straight wire of the same diameter and spanning the same distance.

8. Stage apparatus according to one or more of the clauses 1-6, wherein the electrical connection comprises at least one wire comprising a plurality of loops between the first end and the second end of the electrical connection, the plurality of loops being arranged substantially parallel to each other, such that, during use, corresponding portions of adjacent loops are spaced apart over a distance smaller than or equal to 4, 5, or 6 times the diameter of the wire.

9. Stage apparatus comprising an object table configured to hold a substrate, the object table comprising an electrode configured to be charged by a power source and an electrical connection configured to connect a first terminal electrically connected to the electrode to a second terminal electrically connected to the power source,
which electrical connection comprises at least one wire comprising a plurality of loops between a first end and a second end of the electrical connection, the plurality of loops being arranged substantially parallel to each other, such that, during use, corresponding portions of adjacent loops are spaced apart over a distance smaller than or equal to 4, 5, or 6 times a diameter of the wire.

10. Stage apparatus according to clause 8 or clause 9, wherein a loop diameter is between 3 times and 6 times the diameter of the wire.

11. Stage apparatus according to one or more of the preceding clauses, wherein the electrical connection comprises a plurality of wires arranged as a bundle connector and not arranged in a single plane, a nominal distance between adjacent wires of the bundle connector being smaller or equal to 4, 5, or 6 times the diameter of the wires.

12. Stage apparatus comprising an object table configured to hold a substrate, the object table comprising an electrode configured to be charged by a power source and an electrical connection configured to connect a first terminal electrically connected to the electrode to a second terminal electrically connected to the power source,
wherein the electrical connection comprises a plurality of wires arranged as a bundle connector and not arranged in a single plane, a nominal distance between adjacent wires of the bundle connector being smaller or equal to 4, 5, or 6 times the diameter of the wires.

13. Stage apparatus according to clause 11 or clause 12, wherein the bundle connector comprises at least 4 parallel wires.

14. Stage apparatus according to one or more of clauses 11-13, wherein the first ends and second ends of the plurality of wires are arranged on a circular circumference.

15. Stage apparatus comprising an object table configured to hold a substrate, the object table comprising an electrode configured to be charged by a power source and an electrical connection configured to connect a first terminal electrically connected to the electrode to a second terminal electrically connected to the power source,
wherein the electrical connection comprises a cylinder made of electrically conductive substance, and comprising a plurality of apertures.

16. Stage apparatus according to one or more of the preceding clauses, wherein the electrode is configured to be charged to at least −100 V, −1 kV, −10 kV, or −100 kV by the power source and via the electrical connection.

17. Stage apparatus according to one or more of the preceding clauses, further comprising an electric field shield for shielding at least a part of the electrical connection.

18. Stage apparatus according to clause 17, wherein the electric field shield comprises a first surrounding volume surrounding a first part of the electrical connection including the first end and a second surrounding volume surrounding a second part of the electrical connection including the second end, wherein an outer surface of at least a part of the second surrounding volume is smaller than an inner surface of at least a part of the first surrounding volume, or an inner surface of the at least part of the second surrounding volume is larger than an outer surface of the at least part of the first surrounding volume, said parts of the first and second surrounding volume being configured to be radially adjacent thereby allowing axial movement of the first and second surrounding volumes relative to each other.

19. Stage apparatus according to clause 18, wherein the first and/or the second surrounding volumes are shaped as a hollow cylinder.

20. Stage apparatus according to one or more of the preceding clauses, comprising at least one further electrical connection comprising one or more wires being arranged substantially the same as the one or more wires of the electrical connection.

21. Stage apparatus according to one or more of the preceding clauses, comprising
a positioner comprising a first positioning module and a second positioning module, wherein
the first positioning module is configured to position the object table, and
the second positioning module is configured to position the object table and the first positioning module,
wherein the first positioning module comprises the first terminal electrically connected to the electrode and the second positioning module comprises the second terminal electrically connected to the power source.

22. Stage apparatus according to clause 21, wherein the object table is arranged in the first positioning module and the power source is arranged in the second positioning module.

23. Stage apparatus according to one or more of the preceding clauses, wherein the electrical connection comprises at least one wire arranged in a coil shape comprising a plurality of loops.

24. Stage apparatus according to clause 23, wherein the plurality of loops comprises at least a first loop and a second loop, wherein a diameter of the first loop is different from a diameter of the second loop.

25. Stage apparatus according to clause 24, the plurality of loops comprises at least the first loop, the second loop, and a third loop, wherein
the first loop is arranged closest to the first end among the first, second and third loops,
the third loop is arranged closest to the second end among the first, second and third loops,
the second loop is arranged between the first loop and the third loop,
the plurality of loops is arranged in an increasing arrangement in which the first loop has a smaller diameter than the second loop and the second loop has a smaller diameter than the third loop, or
the plurality of loops is arranged in a decreasing arrangement in which the first loop has a larger diameter than the second loop and the second loop has a larger diameter than the third loop.

26. Stage apparatus according to clause 25,
wherein the electrical connection comprises a plurality of wires arranged in a coil shape comprising a plurality of loops arranged in the increasing arrangement or the decreasing arrangement,
wherein wires arranged adjacent to each other in a direction substantially perpendicular to the first direction alternately are arranged in the increasing arrangement and decreasing arrangement.

27. Stage apparatus according to clause 24 wherein the plurality of loops comprises at least the first loop, the second loop, and a third loop, wherein
the first loop is arranged closest to the first end among the first, second and third loops,
the third loop is arranged closest to the second end among the first, second and third loops,
the second loop is arranged between the first loop and the third loop, and
wherein the second loop has a smaller diameter than the first loop and than the third loop.

28. Stage apparatus according to one or more of the clauses 8-10, 23-27, wherein at least one loop of the plurality of loops is wound in an opposite direction compared to at least one other loop of the plurality of loops.

29. An apparatus comprising a stage apparatus according to one or more of the preceding clauses, wherein the apparatus is a lithographic apparatus, a metrology apparatus, a particle beam apparatus, an electron beam apparatus, an electron beam inspection apparatus, or an inspection apparatus.

30. A stage apparatus comprising:
an object table configured to hold a substrate, the object table comprising an electrode configured to be charged by a power source and an electrical connection configured to electrically connect the electrode to the power source, and
an electric field shield configured to shield at least a part of the electrical connection.

31. The stage apparatus according to clause 30, wherein the electric field shield is arranged between the electrical connection and an object, and wherein the electrode is applied a first voltage by the power source and the object is at a second voltage being different from the first voltage.

32. The stage apparatus according to clause 30 or 31, wherein the electrical connection comprises one or more wires.

33. The stage apparatus according to any of clauses 30 to 32, wherein the electrical connection comprises one or more coils.

34. The stage apparatus according to any of clauses 30 to 33, further comprising a positioner comprising a first positioning module and a second positioning module, wherein
the first positioning module is configured to position the object table, and
the second positioning module is configured to position the object table and the first positioning module.

35. The stage apparatus according to clause 34, wherein the first positioning module is a fine positioning module, and the second positioning module is a coarse positioning module.

36. The stage apparatus according to clause 35, wherein the electrical connection connects the electrode and the second positioning module, or wherein the electrical connection connects the first positioning module and the second positioning module.

37. The stage apparatus according to clause 36, wherein the electric field shield is arranged between the electrical connection and a part of the second positioning module, and wherein the electrode is applied a third voltage by the power source and the part of the second positioning module is at a fourth voltage being different from the third voltage.

38. A stage apparatus comprising:
an object table configured to hold a substrate, the object table comprising an electrode configured to be charged by a power source and an electrical connection configured to electrically connect the electrode to the power source, and
wherein the electrical connection comprises one or more coils, or one or more wires arranged on a circular circumference.

39. The stage apparatus according to clause 38, wherein the one or more coils comprise a plurality of loops, and wherein the plurality of loops comprises at least a first loop and a second loop, wherein a diameter of the first loop is different from a diameter of the second loop.

40. Stage apparatus according to clause 39, the plurality of loops comprises at least the first loop, the second loop, and a third loop, wherein
the first loop is arranged closest to a first end of the electrical connection among the first, second and third loops,
the third loop is arranged closest to a second end of the electrical connection among the first, second and third loops,
the second loop is arranged between the first loop and the third loop,
the plurality of loops is arranged in an increasing arrangement in which the first loop has a smaller diameter than the second loop and the second loop has a smaller diameter than the third loop, or
the plurality of loops is arranged in a decreasing arrangement in which the first loop has a larger diameter than the second loop and the second loop has a larger diameter than the third loop.

41. Stage apparatus according to clause 40,
wherein the plurality of loops of at least two of the one or more coils are arranged in one of the increasing arrangement and the decreasing arrangement,
wherein the at least two of the one or more coils arranged adjacent to each other in a direction substantially perpendicular to a direction of the electrical connection are arranged alternately in the increasing arrangement and decreasing arrangement.

42. Stage apparatus according to clause 39 wherein the plurality of loops comprises at least the first loop, the second loop, and a third loop, wherein
the first loop is arranged closest to the first end of the electrical connection among the first, second and third loops,
the third loop is arranged closest to the second end of the electrical connection among the first, second and third loops,
the second loop is arranged between the first loop and the third loop, and
wherein the second loop has a smaller diameter than the first loop and than the third loop.

43. Stage apparatus according to any of clauses 39 to 42, wherein at least one loop of the plurality of loops is wound in an opposite direction compared to at least one other loop of the plurality of loops.

44. An apparatus comprising a stage apparatus according any of clauses 30 to 43, wherein the apparatus is a lithographic apparatus, a metrology apparatus, a particle beam apparatus, an electron beam apparatus, an electron beam inspection apparatus, or an inspection apparatus.

It is noted that although several embodiments are illustrated herein, numerous other arrangements of one or more wires are possible without departing of the scope of the present invention. For example, instead of the loops a wire may be arranged in a meandering or other curved shape.

It is noted that although the electrical connection and stage apparatus herein are primarily described with respect to an e-beam inspection tool, they may also apply in other applications.

The embodiments of the present disclosure also relate to an apparatus comprising a stage apparatus, wherein the apparatus is a lithographic apparatus, a metrology apparatus, a particle beam apparatus, a particle beam inspection apparatus, or an inspection apparatus.

Although the present disclosure has been explained in relation to its preferred embodiments, it is to be understood that other modifications and variation can be made without departing the spirit and scope of the present disclosure as hereafter claimed.

The invention claimed is:

1. A stage apparatus comprising:
an object table configured to hold a substrate, the object table comprising:
an electrode configured to be charged by a power source, and
an electrical connection configured to connect a first terminal electrically connected to the electrode to a second terminal electrically connected to the power source, wherein the electrical connection comprises one or more wires having a diameter and spanning a distance between a first end and a second end of the electrical connection, and wherein the electrical connection is arranged such that the maximal electric field intensity generated by the electrical connection is smaller than the maximal electric field intensity generated by a straight wire of the same diameter and spanning the same distance.

2. The stage apparatus according to claim 1, wherein the electrical connection comprises at least one wire comprising a plurality of loops between the first end and the second end of the electrical connection, the plurality of loops being arranged substantially parallel to each other, such that, during use, corresponding portions of adjacent loops are spaced apart over a distance less than or equal to 4, 5, or 6 times the diameter of the at least one wire.

3. The stage apparatus according to claim 2, wherein a loop diameter is between 3 times and 6 times the diameter of the at least one wire.

4. The stage apparatus according to claim 2, wherein at least one loop of the plurality of loops is wound in an opposite direction compared to at least one other loop of the plurality of loops.

5. The stage apparatus according to claim 1, wherein the electrical connection comprises a plurality of wires arranged as a bundle connector and not arranged in a single plane, a nominal distance between adjacent wires of the bundle connector being less than or equal to 4, 5, or 6 times the diameter of the plurality of wires.

6. The stage apparatus according to claim 1, wherein the stage apparatus is a lithographic apparatus, a metrology apparatus, a particle beam apparatus, an electron beam apparatus, an electron beam inspection apparatus, or an inspection apparatus.

7. A stage apparatus comprising:
an object table configured to hold a substrate, the object table comprising:
an electrode configured to be charged by a power source, and
an electrical connection configured to connect a first terminal electrically connected to the electrode to a second terminal electrically connected to the power source,
wherein the electrical connection comprises at least one wire comprising a plurality of loops between a first end and a second end of the electrical connection, the plurality of loops being arranged substantially parallel to each other, such that, during use, corresponding portions of adjacent loops are spaced apart over a distance less than or equal to 4, 5, or 6 times a diameter of the at least one wire.

8. The stage apparatus according to claim 7, wherein a loop diameter is between 3 times and 6 times the diameter of the at least one wire.

9. The stage apparatus according to claim 7, wherein the electrical connection comprises a plurality of wires arranged as a bundle connector and not arranged in a single plane, a nominal distance between adjacent wires of the bundle connector being less than or equal to 4, 5, or 6 times a diameter of the plurality of wires.

10. The stage apparatus according to claim 9, wherein the bundle connector comprises at least 4 parallel wires.

11. The stage apparatus according to claim 9, wherein first ends and second ends of the plurality of wires are arranged on a circular circumference.

12. The stage apparatus according to claim 7, wherein the stage apparatus is a lithographic apparatus, a metrology apparatus, a particle beam apparatus, an electron beam apparatus, an electron beam inspection apparatus, or an inspection apparatus.

13. A stage apparatus comprising:
an object table configured to hold a substrate, the object table comprising:
an electrode configured to be charged by a power source, and
an electrical connection configured to connect a first terminal electrically connected to the electrode to a second terminal electrically connected to the power source,
wherein the electrical connection comprises a plurality of wires arranged as a bundle connector and not arranged in a single plane, a nominal distance between adjacent wires of the bundle connector being less than or equal to 4, 5, or 6 times a diameter of the wires.

14. The stage apparatus according to claim 13, wherein the bundle connector comprises at least 4 parallel wires.

15. The stage apparatus according to claim 13, wherein first ends and second ends of the plurality of wires are arranged on a circular circumference.

16. The stage apparatus according to claim 13, wherein the stage apparatus is a lithographic apparatus, a metrology apparatus, a particle beam apparatus, an electron beam apparatus, an electron beam inspection apparatus, or an inspection apparatus.

17. A stage apparatus comprising:
an object table configured to hold a substrate, the object table comprising:
an electrode configured to be charged by a power source, and
an electrical connection configured to connect a first terminal electrically connected to the electrode to a second terminal electrically connected to the power source,
wherein:
the electrical connection comprises a spatial arrangement of one or more wires having a diameter, and spanning a distance in a first direction between a first end and a second end of the electrical connection,
the electrical connection is configured to produce, in use, an electric field, which is partly determined by an equivalent electrical diameter, the equivalent electrical diameter being defined by the spatial arrangement of the one or more wire, and being equal to a diameter of an electrically equivalent wire when arranged substantially straight and for spanning the distance in the first direction,
the electrically equivalent wire is configured to produce an electric field having the substantially same maximal intensity, and
the equivalent electrical diameter is greater than any diameter of the one or more wires.

18. The stage apparatus according to claim 17, wherein the electrical connection further comprises:
a mechanical stiffness representing a force required to compress or stretch the electrical connection for a unit length in the first direction, for which an equivalent mechanical diameter is determined,
wherein:
the equivalent mechanical diameter equals a diameter of a mechanically equivalent wire when arranged substantially straight and spanning the distance in the first direction and
the mechanically equivalent wire would comprise the same mechanical stiffness as the electrical connection, and
the equivalent electrical diameter is greater than the equivalent mechanical diameter.

19. The stage apparatus according to claim 17, wherein the electrical connection comprises a plurality of wires arranged as a bundle connector and not arranged in a single plane, a nominal distance between adjacent wires of the bundle connector being less than or equal to 4, 5, or 6 times the diameter of the one or more wires.

20. The stage apparatus according to claim 17, wherein the stage apparatus is a lithographic apparatus, a metrology apparatus, a particle beam apparatus, an electron beam apparatus, an electron beam inspection apparatus, or an inspection apparatus.

* * * * *